(12) United States Patent
Vrudhula et al.

(10) Patent No.: US 9,876,503 B2
(45) Date of Patent: Jan. 23, 2018

(54) METHOD OF OBFUSCATING DIGITAL LOGIC CIRCUITS USING THRESHOLD VOLTAGE

(71) Applicants: Sarma Vrudhula, Chandler, AZ (US);
Aykut Dengi, Tempe, AZ (US);
Niranjan Kulkarni, Tempe, AZ (US);
Joseph Davis, Mesa, AZ (US)

(72) Inventors: Sarma Vrudhula, Chandler, AZ (US);
Aykut Dengi, Tempe, AZ (US);
Niranjan Kulkarni, Tempe, AZ (US);
Joseph Davis, Mesa, AZ (US)

(73) Assignee: Arixona Board of Regents on Behalf of Arizona State University,
Scottsdale, AZ (US)

( * ) Notice: Subject to any disclaimer, the term of this patent is extended or adjusted under 35 U.S.C. 154(b) by 0 days.

(21) Appl. No.: 15/390,970

(22) Filed: Dec. 27, 2016

(65) Prior Publication Data

US 2017/0187382 A1    Jun. 29, 2017

Related U.S. Application Data

(60) Provisional application No. 62/271,848, filed on Dec. 28, 2015.

(51) Int. Cl.
*H03K 19/20* (2006.01)
*H03K 19/08* (2006.01)
(Continued)

(52) U.S. Cl.
CPC ..... *H03K 19/0813* (2013.01); *H03K 19/0963* (2013.01); *H03K 19/21* (2013.01)

(58) Field of Classification Search
CPC ......... H03K 19/00361; H03K 19/0027; H03K 19/01707; H03K 19/0963; H03K 19/215;
(Continued)

(56) References Cited

U.S. PATENT DOCUMENTS 5,838,166 A * 11/1998 Nakamura ............. H03K 19/23
326/35
8,164,359 B2 * 4/2012 Leshner ............. H03K 19/0813
326/113

OTHER PUBLICATIONS

Author Unknown, "IP Challenges for the Semiconductor Equipment and Materials Industry," Technical Report, Jun. 2012, SEMI, 5 pages.

(Continued)

*Primary Examiner* — Daniel D Chang
(74) *Attorney, Agent, or Firm* — Withrow & Terranova, P.L.L.C.

(57) ABSTRACT

A threshold logic element (TLE) is disclosed. The TLE includes a first input gate network, a second input gate network, and a differential sense amplifier. The first input gate network is configured to receive a first set of logical signals and the second input gate network configured to receive a second set of logical signals. The differential sense amplifier is operably associated with the first input gate network and the second input gate network such that the differential sense amplifier is configured to generate a differential logical output in accordance with a threshold logic function. To obfuscate the TLE, any number of obfuscated transmission gates can be provided in one or both of the input gate networks. The obfuscated transmission gates are obfuscated such that obfuscated transmission gates are incapable of effecting the threshold logic function of the TLE and thus hide the functionality of the TLE.

19 Claims, 4 Drawing Sheets

(51) Int. Cl.
　　　H03K 19/096　　　(2006.01)
　　　H03K 19/21　　　(2006.01)
(58) Field of Classification Search
　　　CPC .... H03K 19/0813; H03K 19/21; G11C 7/065;
　　　　　　　　　　　　　　　　G11C 11/1673; G11C 13/004
　　　USPC ..................................... 326/36, 11, 121, 112
　　　See application file for complete search history.

(56)　　　　　　　　References Cited

OTHER PUBLICATIONS

Author Unknown, "Winning the Battle Against Counterfeit Semiconductor Products," Technical Report, SIA Anti-Counterfeiting Task Force, Aug. 2013, Semiconductor Industry Association, 28 pages.

Baumgarten, Alex, et al., "Preventing IC Piracy Using Reconfigurable Logic Barriers," IEEE Deisgn & Test of Computers, vol. 27, Issue 1, Jan. 2010, IEEE CS, pp. 66-75.

Chen, Qingqing, et al., "The Bistable Ring PUF: A New Architecture for Strong Physical Unclonable Functions," IEEE International Symposium on Hardware-Oriented Security and Trust, Jun. 2011, pp. 134-141.

Gowda, Tejaswi, et al., "Identification of Threshold Functions and Synthesis of Threshold Networks," IEEE Transactions on Computer-Aided Design of Integrated Circuits and Systems, vol. 30, Issue 5, May 2011, IEEE, pp. 665-677.

Guin, Ujjwal, et al., "Counterfeit Integrated Circuits: A Rising Threat in the Global Semiconductor Supply Chain," Proceedings of the IEEE, vol. 102, Issue 8, Aug. 2014, IEEE, pp. 1207-1228.

Kulkarni, Niranjan, et al., "Minimizing Area and Power of Sequential CMOS Cicruits using Threshold Decomposition," International Conference on Computer-Aided Design, Nov. 2012, San Jose, California, ACM, pp. 605-612.

Malik, Shweta, et al., "Development of a Layout-Level Hardware Obfuscation Tool to Counter Reverse Engineering," Master's Theses, University of Massachusetts Amherst, May 2014, 62 pages.

Rajendran, Jeyavijayan, et al., "Security Analysis of Integrated Circuit Camoufiauging," Conference on Computer and Communications Security, Nov. 4-8, 2013, Berlin, Germany, ACM, 12 pages.

Roy, Jarrod, et al., "EPIC: Ending Piracy of Integrated Circuits," Proceedings of the Conference on Design, Automation and Test in Europe, Mar. 10-14, 2008, Munich, Germany, 6 pages.

Sun, Guangyu, et al., "A Watermarking System for IP Protection by Buffer Insertion Technique," International Symposium on Quality Electronic Design, Mar. 2006, IEEE, 5 pages.

Torrance, Randy, et al., "The State-of-the-Art in Semiconductor Reverse Engineering," Design Automation Conference, Jun. 5-10, 2011, San Diego, California, ACM, pp. 333-338.

Wei, Wang, et al., "A flexible logic circuit based on a MOS-NDR transistor in standard CMOS technology," Journal of Semiconductors, vol. 31, Issue 5, May 2010, Chinese Institute of Electronics, 4 pages.

Zhang, Jiliang, "A Practical Logic Obfuscation Technique for Hardware Security," IEEE Transactions on Very Large Scale Integration Systems, 2015, 5 pages.

Zhou, Boyou, et al., "Detecting Hardware Trojans Using Backside Optical Imaging of Embedded Watermarks," Design Automation Conference, Jun. 7-11, 2015, San Francisco, California, ACM, 6 pages.

* cited by examiner

METHOD OF OBFUSCATING DIGITAL LOGIC CIRCUITS USING THRESHOLD VOLTAGE

RELATED APPLICATIONS

This application claims the benefit of provisional patent application Ser. No. 62/271,848, filed Dec. 28, 2015, the disclosure of which is hereby incorporated herein by reference in its entirety.

GOVERNMENT SUPPORT

This invention was made with government funds under contract numbers 1237856 and 1230401 and awarded by the National Science Foundation. The U.S. Government may have rights in this invention.

FIELD OF THE DISCLOSURE

This disclosure relates to threshold logic elements for integrated circuits (ICs).

BACKGROUND

A threshold logic element is defined as an n-input processing element having an output defined as:

$$f_T(X) = \begin{cases} 1, & \text{if } \sum_{i=1}^{n} w_i x_i \geq T \\ 0, & \text{Otherwise} \end{cases} \quad (1)$$

$$f_T(X) = \begin{cases} 1, & \text{if } \sum_{i=1}^{n} w_i x_i \leq T \\ 0, & \text{Otherwise} \end{cases} \quad (2)$$

$$f_T(X) = \begin{cases} 0, & \text{if } \sum_{i=1}^{n} w_i x_i \geq T \\ 1, & \text{Otherwise} \end{cases} \quad (3)$$

$$f_T(X) = \begin{cases} 0, & \text{if } \sum_{i=1}^{n} w_i x_i \leq T \\ 1, & \text{Otherwise} \end{cases} \quad (4)$$

where $X=[x_0, x_1, \ldots, x_{n-1}]$, $W=[w_0, w_1, \ldots, w_{n-1}]$, and T are a set of data inputs that represent Boolean variables, a set of fixed signed integer weights associated with data inputs, and a threshold value, respectively. A threshold logic element may be used to implement a threshold logic function as described by one of the equations above, which is equivalent to a complex Boolean function. Threshold logic elements may occupy less room than a Boolean network needed to implement the complex Boolean function. Thus, threshold logic elements may be used in place of Boolean networks to provide the same functionality while consuming less area in an integrated circuit (IC).

Unfortunately, ICs are subject to piracy. Obfuscation techniques have been developed for Boolean networks that prevent a pirate from reverse engineering an IC formed by Boolean networks by hiding the functionality of the threshold logic network. However, obfuscation techniques have not been developed for threshold logic networks. Furthermore, obfuscation techniques developed for Boolean networks significantly increase the power, delay, and area consumed within the IC.

SUMMARY

Embodiments of a threshold logic element are disclosed. In one embodiment, the threshold logic element includes a first input gate network, a second input gate network, and a differential sense amplifier. The first input gate network is configured to receive a first set of logical signals and the second input gate network is configured to receive a second set of logical signals. The differential sense amplifier is operably associated with the first input gate network and the second input gate network such that the differential sense amplifier is configured to generate a differential logical output in accordance with a threshold logic function. To obfuscate the threshold logic element, the first input gate network includes at least one obfuscated transmission gate. The obfuscated transmission gate is obfuscated such that the obfuscated transmission gate is incapable of effecting the threshold logic function of the threshold logic element. For example, the obfuscated transmission gate may define a threshold voltage greater in magnitude than every one of the threshold voltages of operational transmission gates within first input gate network.

It should be noted that different embodiments of the threshold logic element may include any number of obfuscated transmission gates in the first input gate network and any number of obfuscated transmission gates in the second input gate network. Obfuscated transmission gates hide the functionality of the threshold logic element since modern reverse engineering techniques are incapable of efficiently determining that the obfuscated transmission gates do not effect the threshold logic function of the threshold logic element. Furthermore, obfuscated transmission gates decrease the power, delay, and area consumed within an IC in comparison to Boolean networks that are obfuscated and provide the same functionality.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates one embodiment of a threshold logic element having a first input gate network, a second input gate network, and a differential sense amplifier that generates a differential logical output in accordance with a threshold logic function wherein the first input gate network and the second input gate network include obfuscated transmission gates to obfuscate the threshold logic function implemented by the threshold logic element.

DETAILED DESCRIPTION

Figure 1:
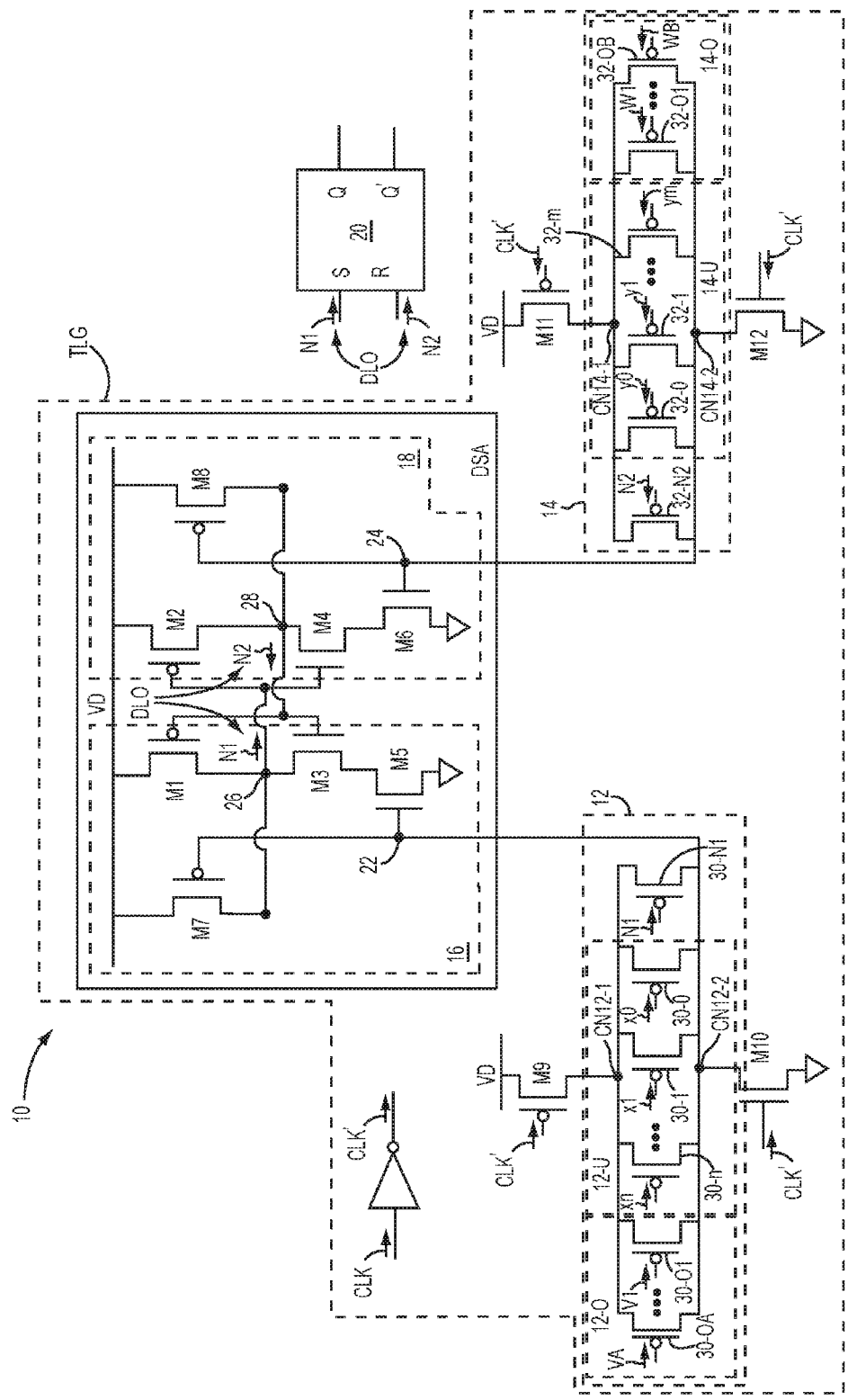

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Furthermore, throughout this disclosure, relative terminology, such as "approximately," "substantially," and the like, may be used to modify a predicate where the predicate describes features and relationships of an apparatus or procedure. The relative terminology that modifies the predicate should be interpreted sensu lato. However, whether the predicate modified by the relative terminology is satisfied is determined in accordance with error ranges and/or variation tolerances for the apparatus or procedure and prescribed by technical standard(s) and/or technical specification(s) relevant to the features and relationships of the apparatus or procedure that are described by the predicate. For example, a particular application employing the apparatus or procedure may be designed to operate in accordance with certain technical standards, specifications, or the like. These technical standards and specifications may explicitly prescribe the error ranges and/or variation tolerances relevant to the features and relationships of the apparatus or procedure described by the predicate. Additionally or alternatively, these technical standards and specifications may describe performance parameters related to the apparatus or procedure from which the error ranges and/or variation tolerances relevant to the features and relationships of the apparatus or procedure described by the predicate can be deduced or inferred.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates an embodiment of a threshold logic element (TLE) 10 configured to perform a threshold logic function. In general, the TLE 10 includes a first input gate network 12, a second input gate network 14, and a differential sense amplifier DSA. The differential sense amplifier DSA is arranged so as to form a first amplifier branch 16 and a second amplifier branch 18. As shown in FIG. 1, the first input gate network 12, the second input gate network 14, and the differential sense amplifier DSA are provided in a TLG, which is the portion of the TLE 10 that implements the threshold logic function. In alternative embodiments of TLEs in accordance with this disclosure, the TLEs only include the TLG.

In this embodiment, the TLE 10 further includes a sequential state element 20. Thus, the TLE 10 is a sequential threshold logical element. The sequential state element 20 is configured to store logical states resulting from logical outputs generated by the TLG as a result of implementing the threshold logic function. The first input gate network 12 is formed by a number of parallel transmission gates and the second input gate network 14 is formed by a number of parallel transmission gates.

In the embodiment shown in FIG. 1, the transmission gates in the first input gate network 12 are driven by a first set of logical signals. As explained in further detail below, the first set of logical signals include a first set of operational logical inputs (referred to generically as elements x and specifically as elements x0 to xn), a first logical output N1 provided as a feedback input from the first amplifier branch 16, and a first set of logical obfuscation inputs (referred to generically as elements V and specifically as elements V1 to VA). Likewise, the second input gate network 14 is formed by a number of parallel transmission gates. The transmission gates in the second input gate network 14 are driven by a second set of logical signals. As explained in further detail below, the second set of logical signals include a second set of operational logical inputs (referred to generically as elements y and specifically as elements y0 to ym), a second logical output N2 provided as a feedback input from the second amplifier branch 18, and a second set of logical obfuscation inputs (referred to generically as elements W and specifically as elements W1 to WZ). When the TLG evaluates the first set of operational logical inputs and the second set of operational inputs so as to implement the threshold logic function, the differential sense amplifier DSA is configured to generate the logical output N1 and the logical output N2 in complementary logical states (i.e., opposite logical states). Consequently, the threshold logical function maps one of the logical outputs N1, N2 to either a logic state of "1" or logical state "0" and thus the other one of the logical outputs N2, N1 is also provided in accordance with the threshold logic function since the other one of the logical outputs N2, N1 is simply mapped to complementary logical state (either the logical state "0" or the logical state "1", respectively). Thus, the logical outputs N1, N2 combine to provide a differential logical output DLO. As explained in further detail below, the differential sense amplifier DSA is configured to feedback the differential logical output DLO generated by the DSA to the first input gate network 12 and the second input gate network 14. By providing the differential logical output DLO as feedback to the first input gate network 12 and the second input gate network 14, the differential logical output DLO is prevented from floating.

In this embodiment, all of the logical signals x, N1, V, y, N2, W, are bounded within approximately the same voltage range. More specifically, the voltage levels of the logical signals x, N1, V, y, N2, W are all equal to or below a maximum voltage level defined by the voltage range and equal to or above a minimum voltage level defined by the voltage range. As explained below, the voltage levels of the logical inputs x, y, may be variable or may be fixed but all of the voltage levels are bounded within the voltage range. To define a logical state of logic "1" and a logical state of logic "0," one or more logical state boundary levels may be defined between the maximum voltage level and the minimum voltage level. In one example, a single logical state boundary level may be defined between the maximum voltage level and the minimum voltage level. For each of the logical signals x, N1, V, y, N2, W, if a voltage level of the logical signal x, N1, V, y, N2, W is above the logical state boundary level, the logical signal x, N1, V, y, N2, W is considered to be in a logical state defined as logic "1." Otherwise, for each of the logical signals x, N1, V, y, N2, W, if the voltage level of the logical signal x, N1, V, y, N2, W is below the logical state boundary level, the logical signal x, N1, V, y, N2, W is considered to be in a logical state defined as logic "0." However, as explained above, the voltage level of each of the logical signal x, N1, V, y, N2, W must be equal to or less than approximately the maximum voltage level and equal to greater than approximately the minimum voltage level defined by the voltage range.

An "operational logical input" is a logical signal that 1) determines the particular threshold logic function implemented by the TLG (i.e., assign the particular threshold logic function performed by the TLG) and/or 2) provide a Boolean variable that is one of the inputs of the threshold logic function implemented by the TLG. As explained in further detail below, the logical signals x, y are all operational logical inputs. A "feedback logical input" is a logical signal used to stabilize and/or reinforce the threshold logic function implemented by the TLE 10. Thus, while feedback logical inputs do not determine the particular threshold logic function implemented by the TLG and are not Boolean variables of the threshold logic function implemented by the TLG. However, a feedback logical input does effect the threshold logic function of the TLE 10 in that a feedback logical input helps stabilize the differential logical output DLO correctly in accordance with the threshold logic function. In this embodiment, the logical outputs N1, N2, are provided as feedback logical inputs as explained in further detail below.

An "logical obfuscation input" is a logical signal that has no effect on the threshold logic function of the TLG. Thus, an logical obfuscation input does not help stabilize the TLG, does not determine which particular threshold logic function implemented by the TLG, and do not provide a Boolean variable of the threshold logic function. It should be noted that the logical obfuscation input may have some impact on the differential logical output DLO in that a logical obfuscation input may result in slight voltage fluctuations in the DLO, due to leakage currents, and other non-ideal effects. However, other than non-ideal effects, the logical obfuscation inputs have no effect on the threshold logic function implemented by the TLG. Instead, a logical obfuscation input is essentially a dummy logical input that is simply there to prevent the threshold logic function of the TLE 10 from being reverse engineered. As explained in further detail below, the logical signals V, W are logical obfuscation inputs.

Referring again to FIG. 1, the first set of operational logical inputs x may include data inputs and/or threshold inputs. Furthermore, the second set of operational logical inputs y may include data inputs and/or threshold inputs. In this manner, the differential sense amplifier DSA is operably associated with the first input gate network 12 and the second input gate network 14 such that the differential sense amplifier DSA is operable to generate the differential logical output DLO in accordance with the threshold logic function performed by the TLE 10. The threshold logic function may be equivalent to a complex Boolean logic function. However, to perform the Boolean logic function, a large network of Boolean logic gates may be needed. By performing the equivalent threshold logic function with the TLE 10 instead of with the large network of Boolean logic gates, the TLE 10 can provide increased spatial efficiency in an integrated circuit (IC).

The first amplifier branch 16 includes an isolated control node 22 operably associated with the first input gate network 12 and the second amplifier branch 18 includes an isolated control node 24 operably associated with the second input gate network 14. Furthermore, the first amplifier branch 16 includes an output node 26 coupled to the sequential state element 20 while the second amplifier branch 18 includes an output node 28 coupled to the sequential state element 20.

In the embodiment shown in FIG. 1, transmission gates in the first input gate network 12 are driven by a subset of the first set of logical signals. The first set of logical signals includes a first set of operational logical inputs (referred to generically as elements x and specifically as elements x0 to xn), a first logical output N1 provided as feedback from the first amplifier branch 16, and a first set of logical obfuscation inputs (referred to generically as elements V and specifically as elements V1 to VA).

The first input gate network 12 is configured to drive the isolated control node 22 of the first amplifier branch 16 based on a subset of the first set of logical signals, wherein the subset of the first set of logical signals include the operational logical inputs x, and the logical output N1. More specifically, the first input gate network 12 is configured to charge the isolated control node 22 based on a number of the transmission gates that are activated by the first set of logical signals, as described in further detail below. As such, the first amplifier branch 16 is configured to generate a logical output N1 of the differential logical output DLO at the output node 26 based on the number of the transmission gates in the first input gate network 12 that are activated by the first set of logical signals. However, the first input gate network 12 is not configured to substantially drive the isolated control node 22 of the first amplifier branch 16 based on the logical obfuscation inputs V since the logical obfuscation inputs V cannot activate their transmission gates as explained in further detail below.

With regards to the second input gate network 14, the second input gate network 14 is driven by a subset of the second set of logical signals (i.e., the second set of operational logical inputs y and the second logical output N2). The second set of logical signals includes a second set of operational logical inputs (referred to generically as elements y and specifically as elements y0 to ym), a second logical output N2 provided as feedback from the second amplifier branch 18, and a second set of logical obfuscation inputs (referred to generically as elements W and specifically as elements W1 to WB). The second input gate network 14 is configured to drive the isolated control node 24 of the second amplifier branch 18 based on the subset of the second set of logical signals, wherein the subset of the second set of logical signals include the operational logical inputs y, and the logical output N2. More specifically, the second input gate network 14 is configured to charge the isolated control node 24 based on a number of the transmission gates that are activated by the second set of logical signals, as described in further detail below. As such, the second amplifier branch 18 is configured to generate a logical output N2 of the differential logical output DLO at the output node 28 based on the number of the transmission gates in the second input gate network 14 that are activated by the second set of logical signals. However, the second input gate network 14 is not configured to substantially drive the isolated control node 24 of the second amplifier branch 18 based on the logical obfuscation inputs W since the logical obfuscation inputs W cannot activate their transmission gates as explained in further detail below.

The differential sense amplifier DSA is configured to generate the differential logical output DLO in accordance with a threshold logic function. In this embodiment, the differential sense amplifier DSA is formed by transistors M1-M8. More specifically, the first amplifier branch 16 is formed by transistors M1, M3, M5, and M7 connected as shown. Likewise, the second amplifier branch 18 is formed by transistors M2, M4, M6, and M8 connected as shown. The sequential state element 20 has a first input terminal S connected to an output node 26 of the first amplifier branch 16 and a second input terminal R connected to an output node 28 of the second amplifier branch 18. Based on the differential logical output DLO at the output nodes 26 and 28, the sequential state element 20 operates to provide a logical output Q and an inverted logical output Q', which is inverted with respect to the logical output Q.

To time the operation of the TLE 10, a transistor M9 and a transistor M10 are each coupled to the first input gate network 12. Both the transistor M9 and the transistor M10 are configured so as to receive an inverted clock signal CLK', which is an inverse of a non-inverted clock signal CLK. Furthermore, a transistor M11 and a transistor M12 are each coupled to the second input gate network 14. The transistor M11 and the transistor M12 are also each configured so as to receive the inverted clock signal CLK'. Each of the transistors M1 through M12 is a field effect transistor (FET), such as a Complementary Metal-Oxide-Semiconductor (CMOS) transistor. However, the present invention is not limited thereto and other types of transistors, such as other types of FETs, may be utilized.

With respect to the first amplifier branch 16, each of the transistors M1, M7 is a P-channel field effect transistor (PFET). Each of the transistors M1, M7 also has a source coupled to receive a supply voltage VD and a drain coupled to the output node 26. A gate of the transistor M1 is coupled to the output node 28 of the second amplifier branch 18 and is thus configured to receive the logical output N2 from the second amplifier branch 18. A gate of the transistor M7 is coupled to the isolated control node 22. Thus, the transistors M1, M7 are each configured to drive the output node 26 near a DC voltage level of the supply voltage VD when activated. As such, the transistors M1, M7 drive the logical output N1 at the output node 26 to a logical "1" when activated, as explained in further detail below. Each of the transistors M3, M5 is an N-channel field effect transistor (NFET). A drain of the transistor M3 is coupled to the output node 26, and a source of the transistor M3 is coupled to a drain of the transistor M5. A source of the transistor M5 is coupled to ground. Accordingly, the transistor M3 and the transistor M5 form a discharge path between the output node 26 and ground. When either or both of the transistor M3 or the transistor M5 are deactivated, the discharge path is opened. However, when both the transistors M3, M5 are activated the discharge path is closed. As such, the output node 26 is discharged and pulled near ground. Accordingly, the transistors M3, M5 drive the logical output N1 to a logical "0" when activated.

In this embodiment, the gate of the transistor M3 is coupled to the output node 28 of the second amplifier branch 18 and is thus also configured to receive the logical output N2 from the second amplifier branch 18. A gate of the transistor M5 is coupled to the isolated control node 22. In this manner, the first amplifier branch 16 forms a first NAND gate, where the isolated control node 22 can be considered an input node and the gate of the transistor M1 can be considered as another input node. The output node 26 provides the output node of the first NAND gate.

With regard to the transistor M9 coupled to the first input gate network 12, the transistor M9 is a PFET. A source of the transistor M9 receives the supply voltage VD. A drain of the transistor M9 is coupled to a common node CN12-1 of the first input gate network 12. A gate of the transistor M9 is coupled to receive the inverted clock signal CLK'.

With regard to the transistor M10 coupled to the first input gate network 12, the transistor M10 is an NFET. A drain of the transistor M10 is coupled to a common node CN12-2 of the first input gate network 12. The common node CN12-2 is coupled to the isolated control node 22 of the first amplifier branch 16 and thus also to the gate of the transistor M5 and the gate of the transistor M7. A source of the transistor M10 is coupled to ground. A gate of the transistor M10 is coupled to receive the inverted clock signal CLK'.

With respect to the second amplifier branch 18, each of the transistors M2, M8 is a PFET. Each of the transistors M2, M8 also has a source coupled to receive the supply voltage VD and a drain coupled to the output node 28. A gate of the transistor M2 is coupled to the output node 26 of the first amplifier branch 16 and is thus configured to receive the first logical output N1 from the first amplifier branch 16. A gate of the transistor M8 is coupled to the isolated control node 24. Thus, the transistors M2, M8 are each configured to drive the output node 28 near the DC voltage level of the supply voltage VD when activated. As such, the transistors M2, M8 drive the logical output N2 at the output node 28 to a logical "1" when activated, as explained in further detail below. Each of the transistors M4, M6 is a NFET. A drain of the transistor M4 is coupled to the output node 28 and a source of the transistor M4 is coupled to a drain of the transistor M6. A source of the transistor M6 is coupled to ground. Accordingly, the transistor M4 and the transistor M6 form a discharge path between the output node 28 and ground. When either or both of the transistor M4 or the transistor M6 are deactivated, the discharge path is opened. However, when both the transistors M5, M6 are activated the discharge path is closed. As such, the output node 28 is discharged and pulled near ground. Accordingly, the transistors M3, M5 drive the logical output N2 to a logical "0" when activated.

The gate of the transistor M4 is coupled to the output node 26 of the first amplifier branch 16 and is thus also configured to receive the logical output N1 from the first amplifier branch 16. The gate of the transistor M6 is coupled to the isolated control node 24. In this manner, the second amplifier branch 18 forms a second NAND gate, where the isolated control node 24 can be considered an input node, and the gate of the transistor M2 can be considered as another input node. The output node 28 provides the output node of the second NAND gate. As such, the first NAND gate (i.e., in this embodiment, the first amplifier branch 16) and the second NAND gate (i.e., in this embodiment, the second amplifier branch 18) that form the differential sense amplifier DSA are cross-coupled NAND gates.

With regard to the transistor M11 coupled to the second input gate network 14, the transistor M11 is a PFET. A source of the transistor M11 receives the supply voltage VD. A drain of the transistor M11 is coupled to a common node CN14-1 of the second input gate network 14. A gate of the transistor M11 is coupled to receive the inverted clock signal CLK'.

With regard to the transistor M12 coupled to the second input gate network 14, the transistor M12 is an NFET. A drain of the transistor M12 is coupled to a common node CN14-2 of the second input gate network 14. The common node CN14-2 is coupled to the isolated control node 24 of the second amplifier branch 18 and thus also to the gate of the transistor M6 and the gate of the transistor M8. A source of the transistor M12 is coupled to ground. A gate of the transistor M12 is coupled to receive the inverted clock signal CLK'.

During a normal operating mode, the TLE 10 of FIG. 1 operable in a reset state and an evaluation state. The TLE 10 cycles through the reset state and the evaluation state during the normal operating mode in accordance with the non-inverted clock signal CLK and the inverted clock signal CLK'. More specifically, in order to enter the reset state, the non-inverted clock signal CLK is set to a voltage level corresponding to a logic "0," and therefore the inverted clock signal CLK' is set to a voltage level corresponding to a logic "1." As a result, the transistor M10 and the transistor M12 are both activated, and the transistor M9 and the transistor M11 are both deactivated. Therefore, the isolated control node 22 is discharged through transistor M10, and the isolated control node 24 is discharged through the transistor M12. Accordingly, the isolated control node 22 and the isolated control node 24 are each pulled near ground and provided at logic "0." Also, since the transistor M10 and the transistor M12 are both activated, and the transistor M9 and the transistor M11 are both deactivated, the transmission gates in the first input gate network 12 and the transmission gates in the second input gate network 14 are deactivated during the reset state.

When the isolated control node 22 and the isolated control node 24 of the first amplifier branch 16 and the second amplifier branch 18, respectively, are pulled to logic "0," the transistors M7 and M8 are activated, and the transistors M5 and M6 are deactivated. The discharge path formed by the transistors M3, M5 in the first amplifier branch 16 and the discharge path formed by the transistors M4, M6 in the second amplifier branch 18 are thus both open. The output nodes 26, 28 are prevented from being discharged in the reset state. Furthermore, the transistors M7 is configured to pull the output node 26 of the first amplifier branch 16 near the DC supply voltage level of the supply voltage VD in response to the isolated control node 22 being near ground and at a logic "0." Accordingly, the first logical output N1 is provided at a logic "1" since the output node 26 is charged to a high voltage state (i.e., near a DC voltage magnitude of the supply voltage VD) during the reset state. Likewise, and the transistor M8 is configured to pull the output node 28 of the second amplifier branch 18 near the DC supply voltage level of the supply voltage VD in response to the isolated control node 24 being near ground and at a logic "0.", Thus, the second logical output N2 is also provided at logic "1" since the output node 28 is charged to a high voltage state (i.e., near a DC voltage magnitude of the supply voltage VD) during the reset state. The differential logical output DLO is thus set to a precharge state of "1/1" during the reset state of the TLE. Once the reset state is complete, the transistors M1, M2, M3, M4, M5, and M6 are deactivated, and the remaining transistors, M7, and M8 are activated. At this point, the TLE 10 is primed for evaluation.

On the rising edge of the non-inverted clock signal CLK and falling edge of the inverted clock signal CLK', the TLE 10 transitions to the evaluation state. The TLE 10 is maintained in the evaluation state while the non-inverted clock signal CLK is a logic "1" and the inverted clock signal CLK' is a logic "0." The differential sense amplifier DSA is configured to set one of the logical outputs N1, N2 to a logic "0" and maintain the other one of the logical outputs N2, N1 at a logic "1" during the evaluation state. More specifically, the differential sense amplifier DSA is configured to discharge one of the output nodes 26, 28 to a low voltage state (i.e. logic "0") and prevent the discharge of the other one of the output nodes 28, 26 so as to maintain the other one of the output nodes in the high voltage state (logic "1") during the evaluation state. The differential logic output DLO is thus provided in either a first differential logical state (e.g., "1/0") or in a second differential logical state (e.g., "0/1") opposite the second differential logical state during the evaluation state. This may result in a transition in logical output Q and logical output Q' of the sequential state element 20.

More specifically, as the non-inverted clock signal CLK rises and the inverted clock signal CLK' falls; a current race begins between the first amplifier branch 16 and the second amplifier branch 18. During the evaluation state, the transistor M10 and the transistor M12 are both deactivated, and the transistor M9 and the transistor M11 are both activated. The transistor M10 and the transistor M12 therefore prevent the isolated control node 22 and the isolated control node 24 from being discharged through the transistor M10 and the transistor M12, respectively. Furthermore, the transistor M9 and the transistor M10 pull the common node CN12-1 and the common node CN14-1 near the DC supply voltage level of the supply voltage VD. Accordingly, the transmission gates in the first input gate network 12 are operable to be activated based on the first set of logical signals and the transmission gates in the second input gate network 14 are operable to be activated based on the set of logical signals during the evaluation state.

The differential sense amplifier DSA is operably associated with the first input gate network 12 and the second input gate network 14 such that the first amplifier branch 16 wins the current race when a number of the transmission gates that are activated in the first input gate network 12 is greater than a number of the transmission gates that are activated in the second input gate network 14. In this case, a conductance of the first input gate network 12 is greater than a conductance of the second input gate network 14. Furthermore, the differential sense amplifier DSA is operably associated with the first input gate network 12 and the second input gate network 14 such that the second amplifier branch 18 wins the current race when the number of the transmission gates that are activated in the second input gate network 14 is greater than the number of the transmission gates that are activated in the first input gate network 12. In this case, the conductance of the second input gate network 14 is greater than a conductance of the first input gate network 12.

More specifically, the first amplifier branch 16 wins the current race if the first input gate network 12 charges the isolated control node 22 of the first amplifier branch 16 to a voltage level sufficient (i.e. a logic "1") to activate the transistor M5 and deactivate the transistor M7 before the second input gate network 14 charges the isolated control node 24 of the second amplifier branch to a voltage level (i.e.

a logic "1") sufficient to activate the transistor M6 and deactivate the transistor M8. Note that the gate of the transistor M3 is coupled to the output node 28 so as to receive the logical output N2 as feedback from the second amplifier branch 18. Additionally, the gate of the transistor M4 is coupled to the output node 26 so as to receive the logical output N1 as feedback from the first amplifier branch 16 Since both the logical outputs N1, N2 where set to logic "1" during the reset state, the gates of both the transistors M3, M4 initially receive a logic "1" at the beginning of the evaluation state. Furthermore, the gate of the transistor M7 is coupled to the isolated control node 22 and the gate of the transistor M8 is coupled to the isolated control node 24. Accordingly, the isolated control node 22, 24 that is provided at logic "1" fastest will result in either the transistor M7 or the transistor M8 being deactivated and either the transistors M3, M5 or the transistors M4, M6 being activated. If the transistors M3, M5 are activated, the discharge path formed by the transistors M3, M5 is closed and the output node 26 is discharged. Accordingly, the logical output N1 is provided at logic "0." In response, the transistor M2 is activated to maintain the output node 28 and the logical output N2 at logic "1." If the transistors M4, M6 are activated, the discharge path formed by the transistors M4, M6 is closed and the output node 28 is discharged. Accordingly, the logical output N2 is provided at logic "0." In response, the transistor M1 is activated to maintain the output node 26 and the logical output N1 at logic "1."

In this manner, the differential sense amplifier DSA is configured to perform the threshold logic function based on the first set of operational logical inputs x and the second set of operational logical inputs y. More specifically, the first amplifier branch 16 wins the current race if the number of transmission gates in the first input gate network 12 activated by the first set of operational logical inputs x is larger than the number of transmission gates in the second input gate network 14 activated by the second set of inputs y. In this case, due to a conductance of the first input gate network 12 being higher than a conductance of the second input gate network 14, the isolated control node 22 starts to charge before the isolated control node 24. Accordingly, the isolated control node 22 activates the transistor M5 and deactivates the transistor M7. As a result, the output node 26 starts to discharge through the transistor M3 and the transistor M5. The first logical output N1 is thus set to a logical "0" during the evaluation state of the TLE 10. The delay in the start time for charging the output node 28 causes the first logical output N1 to activate the transistor M2. Thus, even if the output node 28 starts to discharge, the discharge of the output node 28 is impeded by the transistor M2 (which is activated) thereby resulting in the output node 28 getting quickly pulled back to the high voltage state. Thus, the second logical output N2 is maintained at logical "1." Accordingly, the differential logical output DLO is provided to have a differential logical state of "0/1," during the evaluation state when a number of the transmission gates 30 are active in the first input gate network 12 is greater than a number of the transmission gates 32 active in the second input gate network 14 during the evaluation state.

Likewise, the second amplifier branch 18 wins the current race if the second input gate network 14 charges the output node 28 of the second input gate network 14 to a voltage level sufficient to activate the transistor M6 and deactivate the transistor M8 before the first input gate network 12 charges the output node 26 of the first input gate network 12 to a voltage level sufficient to activate the transistor M5 and deactivate the transistor M7. In one embodiment, the second input gate network 14 wins the current race if the number of transmission gates in the second input gate network 14 activated by the second set of operational logical inputs y is larger than the number of transmission gates in the first input gate network 12 activated by the first set of operational logical inputs x. Due to a conductance of the second input gate network 14 being higher than a conductance of the first input gate network 12, the isolated control node 24 starts to charge before the isolated control node 22. Accordingly, the isolated control node 24 activates the transistor M6 and deactivates the transistor M8. As a result, the output node 28 starts to discharge through the transistor M4 and the transistor M6. The first logical output N1 is thus set to a logical "0" during the evaluation state of the TLE 10. The delay in the start time for charging the output node 26 causes the second logical output N2 to activate the transistor M1. Thus, even if the output node 26 starts to discharge, the discharge of the output node 26 is impeded by the transistor M1 (which is activated) thereby resulting in the output node 26 getting quickly pulled back to the high voltage state and the first logical output N1 being maintained at logical "1." Accordingly, the differential logical output DLO is provided to have a differential logical state of "1/0."

The logical outputs Q and Q' of the sequential state element 20 are adjusted accordingly by the sequential state element 20. The differential logical output DLO includes a first logical output N1 that is received by the input terminal S of the sequential state element 20. In this embodiment, the sequential state element 20 is an SR latch. The input terminal S is the set terminal of the sequential state element 20, and the first logical output N1 is received at the input terminal S. The differential logical output DLO includes a second logical output N2 that is received by the input terminal R of the sequential state element 20. The input terminal N2 is the reset terminal of the sequential state element 20, and the second logical output N2 is received at the input terminal R. Note that when the differential logical output is set to the precharge state after the reset state, the sequential state element 20 is configured to hold the logical output Q and the inverted logical output Q'. However, after the evaluation state, the sequential state element 20 is configured to set the logical output Q to logic "1" and the inverted logical output Q' to logic "0" in response to the differential logical output DLO being provided at the differential logical state of "0/1" and to set the logical output Q to logic "0" and the inverted logical output Q' to logic "1" in response to the differential logical output DLO being provided at the differential logical state of "1/0."

Furthermore, note that after evaluation completes, all nodes in the TLE 10 have a closed path to either the supply voltage VD or ground. Because of this, the output nodes 26, 28 are latched, and no change in the active number of transmission gates in either of the first input gate network 12 and the second input gate network 14 will have any effect on the logical states stored at the output nodes 26, 28 until the beginning of the next evaluation.

Additionally, note that whether the first input gate network 12 or the second input gate network 14 wins the current race may depend on the number of active transmission gates, as discussed above. However, transistor size or gate widths for the gates forming the first input gate network 12 and the second input gate network 14 may vary in order to allow weighting of the first set of inputs and the second set of inputs. Thus, in this case, the current race may depend on the number of active transmission gates and the sizes or widths of those active gates. Also note that weighting may be performed by allocation of one or more gates per input or, in other words, by providing a single input to multiple gates. Alternatively, each of the transmission gates in the first input gate network 12 and the second input gate network 14 may be the same. More than one of the first set of operational logical inputs and/or the second set of operational logical inputs may represent the same Boolean variable so that the Boolean variable is given a weight greater than one.

Referring again to FIG. 1, FIG. 1 illustrates embodiments of the first input gate network 12 and the second input gate network 14. In this embodiment, the first input gate network 12 and the second input gate network 14 are implemented as transmission gate networks. In the illustrated embodiment, the first input gate network 12 is formed by a number of transmission gates 30-0 through 30-$n$, 30-N1, 30-O1 through 30-OA (referred to generically as elements "30") connected in parallel branches of the first input gate network 12.

Each of the transmission gates 30 of the first input gate network 12 has a gate that is configured to receive a corresponding one of the first set of logical signals. More specifically, the gate of each of the operational transmission gates 30-0 to 30-$n$ is configured to receive a different corresponding one of the set of operational logical inputs x0-xn. The transmission gate 30-N1 is configured to receive the first logical output N1 from the output node 26 of the first amplifier branch 16 in the differential sense amplifier DSA. The gate of each of the operational transmission gates 30-O1 to 30-OA is configured to receive a different corresponding one of the set of logical obfuscation inputs VO-VA. During the evaluation state, the transmission gate 30-N1 is configured to drive the isolated control node 22 in accordance to the first logical output N1 of the first amplifier branch 16. For example, if the first logical output N1 is provided at logical "0" during the evaluation state, the isolated control node 22 is driven by the transmission gate 30-N1 to a logical "1" since the transmission gate 30-N1 is activated by the first logical output N1. This is because the common control node CN12-2 and the isolated control node 22 are driven by the transmission gate 30-N1 near the DC voltage level of the supply voltage VD. As such, the first logical output N1 is also driven by the transmission gate 30-N1 to maintain the logical "0." Furthermore, if the first logical output N1 is provided at logical "1" during the evaluation state, the isolated control node 22 is driven by the transmission gate 30-N1 to a logical "0." As such, the first logical output N1 is also driven by the transmission gate 30-N1 to maintain the logical "1."

Likewise, each of the transmission gates 32 also has a gate that is configured to receive a corresponding one of the second set of logical signals. More specifically, the gate of each of the transmission gates 32-0 to 30-$m$ is configured to receive a different corresponding one of the second set of operational logical inputs y0-ym. The transmission gate 32-N2 is configured to receive the second logical output N2 from the output node 28 of the second amplifier branch 18 in the differential sense amplifier DSA. During the evaluation state, the transmission gate 32-N2 is configured to drive the isolated control node 24 in accordance with the second logical output N2 of the second amplifier branch 18. For example, if the second logical output N2 is provided at logical "0" during the evaluation state, the isolated control node 24 is driven by the transmission gate 32-N2 to a logical "1" since the transmission gate 32-N2 is activated by the second logical output N2. This is because the common control node CN14-2 and the isolated control node 24 are driven by the transmission gate 32-N2 near the DC voltage level of the supply voltage VD. As such, the second logical output N2 is also driven by the transmission gate 32-N2 to maintain the logical "0" since the transmission gate 32-N2 is deactivated by the second logical output N2. This is because the common control node CN14-2 and the isolated control node 24 are driven by the transmission gate 32-N2 near the ground. Furthermore, if the second logical output N2 is provided at logical "1" during the evaluation state, the isolated control node 24 is driven by the transmission gate 32-N2 to a logical "0." As such, the second logical output N2 is also driven by the transmission gate 32-N2 to maintain the logical "1."

In this embodiment, each of the transmission gates 30 is a PFET (such as a PMOS) and has a source coupled to the common node CN12-1 and thus the drain of the transistor M9. Each of the transmission gates 30 also has a drain coupled to the common node CN12-2 and thus the drain of the transistor M10. In this embodiment, the transistor M9 is configured to be deactivated by inverted clock signal CLK', and the transistor M10 is configured to be activated by the inverted clock signal CLK' during the reset state of the TLE 10. The transistors M9 and M10 thus deactivate the transmission gates 30-0 through 30-$n$, 30-N1 when the inverted clock signal CLK' is low and thus activate the transmission gates 30-0 through 30-$n$, 30-N1 when the inverted clock signal CLK' is high. Furthermore, the transistor M9 is configured to be activated by inverted clock signal CLK' and the transistor M10 is configured to be deactivated by the inverted clock signal CLK' during the evaluation state of the TLE 10. The transistors M9 and M10 thus allow for the activation of the transmission gates 30-0 through 30-$n$, 30-N1 by the subset of the first set of logical signals, x, N1. Thus, by providing the transistors M9 and M10, the inverted clock signal CLK' is fed to the first input gate network 12 without (significantly) loading the differential sense amplifier DSA. The arrangement also reduces variability in a clock input capacitance when different numbers of the transmission gates 30 in the first input gate network 12 are activated.

Each of the transmission gates 32 is also a PFET (such as a PMOS) and has a source coupled to the common node CN14-1 and thus the drain of the transistor M11. Each of the transmission gates 32 also has a drain coupled to the common node CN14-2 and thus the drain of the transistor M12. In this embodiment, the transistor M11 is configured to be deactivated by inverted clock signal CLK', and the transistor M12 is configured to be activated by the inverted clock signal CLK' during the reset state of the TLE 10. The transistors M11 and M12 thus deactivate the transmission gates 32-0 through 32-$m$, 32-N2 when the inverted clock signal CLK' is low and thus activate the transmission gates 32 when the inverted clock signal CLK is high. Furthermore, the transistor M11 is configured to be activated by inverted clock signal CLK' and the transistor M12 is configured to be deactivated by the inverted clock signal CLK' during the evaluation state of the TLE 10. The transistors M11 and M12 thus allow for the activation of the transmission gates 32-0 through 32-$m$, 32-N2 by the subset of logical signals y, N2 during the evaluation state. Thus, by providing the transistors M11 and M12, the inverted clock signal CLK' is fed to the second input gate network 14 without (significantly) loading the differential sense amplifier DSA. The arrangement also reduces variability in a clock input capacitance when different numbers of the transmission gates in the second input gate network 14 are activated. Note that the number of transmission gates (n+1+A) in the first input gate network 12 and the number of gates (m+1+B) in the second input gate network 14 may or may not be equal depending on the particular implementation of the TLE 10.

In this embodiment, the first input gate network 12 includes a subnetwork 12-U that has the transmission gates 30-0 through 30-n and the second input gate network 14 includes a subnetwork 14-U that has the transmission gates 32-0 through 32-m. The subset of the transmission gates 30-0 through 30-n in the subnetwork 12-U of the first input gate network 12 are all operational transmission gates. The subset of the transmission gates 32-0 through 32-m in the subnetwork 14-U of the second input gate network 14 are also all operational transmission gates. An "operational transmission gate" is a transmission gate that determines the particular threshold logic function assigned to be implemented by the TLE 10 and/or provides a logical variable where the threshold logic function of the TLE 10 depends on the logical variable.

In this embodiment, the operational transmission gates 30-0 through 30-n correspond with a set of threshold voltages such that each of the operational transmission gates 30-0 through 30-n defines a corresponding one of the set of threshold voltages. The threshold voltage magnitudes of every one of the set of threshold voltages of the operational transmission gates 30-0 through 30-n is less than a maximum voltage magnitude that can be applied to the operational transmission gates 30-0 through 30-n by operational logical inputs x0-xn. The operational transmission gates 32-0 through 32-m correspond with a set of threshold voltages such that each of the operational transmission gates 32-0 through 32-m defines a corresponding one of the set of threshold voltages. The threshold voltage magnitudes of every one of the set of threshold voltages of the operational transmission gates 32-0 through 32-m is less than a maximum voltage magnitude that can be applied to the operational transmission gates 32-0 through 32-m by the operational logical inputs y0-ym. In this embodiment, each of the operational transmission gates 30-0 through 30-n and each of the operational transmission gates 32-0 through 32-m are substantially identical. More specifically, the threshold voltages of every one of the obfuscated transmission gates 30-O1 through 30-OA is approximately equal to -TVN.

The operational transmission gate 30-0 is capable of effecting the threshold logic function because the operational transmission gate 30-0 determines the particular threshold logic function implemented by the TLE 10 and/or provides a logical variable that determines the result of the threshold logic function implemented by the TLE 10. As shown in FIG. 1, the operational transmission gate 30-0 is configured to receive a operational logical input x0, which is one of the logical signals in the first set of logical signals. The operational transmission gate 30-0 is configured such that the threshold logic function assigned to be implemented by the TLE 10, as explained in further detail below. Furthermore, if the operational logical input x0 is a Boolean variable rather than a threshold input, the threshold logic function is dependent of the operational logical input x0, as explained in further detail below. Thus, the operational logical input x0 may be any type of logical signal including a threshold input or a data input. Accordingly, whether the differential sense amplifier DSA provides the differential logical output DLO in a first differential logical state (e.g., "1/0") or in a second differential logical state (e.g., "0/1") opposite the second differential logical state based partially on the operational logical input x0.

Just like the other logical signals in the first set of logical signals, the operational logical input x0 is bounded so that a voltage level of the operational logical input x0 has a voltage range between the maximum voltage level (which in this embodiment is approximately the DC voltage level of the supply voltage VD) and the minimum voltage level of (which in this embodiment is approximately ground). As such, a maximum voltage magnitude applied to the operational transmission gate 30-0 by operational logical input x0 is approximately equal to an absolute value of a voltage difference between the maximum voltage level and the minimum voltage level (which in this embodiment is approximately the DC voltage magnitude |VD| of the supply voltage VD). However, the operational transmission gate 30-0 is configured to define a threshold voltage such that the operational transmission gate 30-0 is capable of being turned on by the operational logical input x0. More specifically, the operational transmission gate 30-0 is configured to define the threshold voltage such that the threshold voltage has a threshold voltage magnitude between the maximum voltage magnitude applied by the operational logical input x0 and the minimum voltage magnitude applied by the operational logical input x0. In this embodiment, the threshold voltage of the operational transmission gate 30-0 is approximately equal to -TNV and thus the threshold voltage has a threshold voltage magnitude |TNV|. The threshold voltage magnitude |TNV| of the threshold voltage is less than the maximum voltage magnitude |VD| that can be applied to the operational transmission gate 30-0 by operational logical input x0.

The operational transmission gate 30-n is capable of effecting the threshold logic function because the operational transmission gate 30-n determines the particular threshold logic function implemented by the TLE 10 and/or provides a logical variable that determines the result of the threshold logic function implemented by the TLE 10. As shown in FIG. 1, the operational transmission gate 30-n is configured to receive a operational logical input xn, which is one of the logical signals in the first set of logical signals. The operational transmission gate 30-n is configured such that the threshold logic function assigned to be implemented by the TLE 10, as explained in further detail below. Furthermore, if the operational logical input xn is a Boolean variable rather than a threshold input, the threshold logic function is dependent of the operational logical input xn, as explained in further detail below. Thus, the operational logical input xn may be any type of logical signal including a threshold input or a data input. Accordingly, whether the differential sense amplifier DSA provides the differential logical output DLO in a first differential logical state (e.g., "1/0") or in a second differential logical state (e.g., "0/1") opposite the second differential logical state based partially on the operational logical input xn.

Just like the other logical signals in the first set of logical signals, the operational logical input xn is bounded so that a voltage level of the operational logical input xn has a voltage range between the maximum voltage level (which in this embodiment is approximately the DC voltage level of the supply voltage VD) and the minimum voltage level of (which in this embodiment is approximately ground). As such, a maximum voltage magnitude applied to the operational transmission gate 30-n by operational logical input xn is approximately equal to an absolute value of a voltage difference between the maximum voltage level and the minimum voltage level (which in this embodiment is approximately the DC voltage magnitude |VD| of the supply voltage VD). However, the operational transmission gate 30-n is configured to define a threshold voltage such that the operational transmission gate 30-n is capable of being turned on by the operational logical input xn. More specifically, the operational transmission gate 30-*n* is configured to define the threshold voltage such that the threshold voltage has a threshold voltage magnitude between the maximum voltage magnitude applied by the operational logical input xn and the minimum voltage magnitude applied by the operational logical input xn. In this embodiment, the threshold voltage of the operational transmission gate 30-*n* is approximately equal to −TNV and thus the threshold voltage has a threshold voltage magnitude |TNV|. The threshold voltage magnitude |TNV| of the threshold voltage is less than the maximum voltage magnitude |VD| that can be applied to the operational transmission gate 30-*n* by operational logical input xn.

In this case, the operational transmission gate 30-*n* is a FET and in particular a PFET. The operational transmission gate 30-*n* thus has a drain, a source, and a gate wherein the operational transmission gate 30-*n* cannot be turned on until a gate to source voltage is approximately equal to or more negative than the threshold voltage −TNV. However, the maximum voltage magnitude |VD| that can be applied by the operational logical input xn between the gate and source of the operational transmission gate 30-*n* is sufficient to turn on the operational transmission gate 30-*n* since the threshold voltage magnitude |TNV| of the threshold voltage is less than the maximum voltage magnitude |VD| that can be applied to the operational transmission gate 30-*n* by operational logical input xn. The operational logical input xn assigned to the operational transmission gate 30-*n* is explained in further detail below.

The operational transmission gate 32-0 is capable of effecting the threshold logic function because the operational transmission gate 32-0 determines the particular threshold logic function implemented by the TLE 10 and/or provides a logical variable that determines the result of the threshold logic function implemented by the TLE 10. As shown in FIG. 1, the operational transmission gate 32-0 is configured to receive a operational logical input y0, which is one of the logical signals in the second set of logical signals. The operational transmission gate 32-0 is configured such that the threshold logic function assigned to be implemented by the TLE 10, as explained in further detail below. Furthermore, if the operational logical input y0 is a Boolean variable rather than a threshold input, the threshold logic function is dependent of the operational logical input y0, as explained in further detail below. Thus, the operational logical input y0 may be any type of logical signal including a threshold input or a data input. Accordingly, whether the differential sense amplifier DSA provides the differential logical output DLO in a first differential logical state (e.g., "1/0") or in a second differential logical state (e.g., "0/1") opposite the second differential logical state based partially on the operational logical input y0.

Just like the other logical signals in the second set of logical signals, the operational logical input y0 is bounded so that a voltage level of the operational logical input y0 has a voltage range between the maximum voltage level (which in this embodiment is approximately the DC voltage level of the supply voltage VD) and the minimum voltage level of (which in this embodiment is approximately ground). As such, a maximum voltage magnitude applied to the operational transmission gate 32-0 by operational logical input y0 is approximately equal to an absolute value of a voltage difference between the maximum voltage level and the minimum voltage level (which in this embodiment is approximately the DC voltage magnitude |VD| of the supply voltage VD). However, the operational transmission gate 32-0 is configured to define a threshold voltage such that the operational transmission gate 32-0 is capable of being turned on by the operational logical input y0. More specifically, the operational transmission gate 32-0 is configured to define the threshold voltage such that the threshold voltage has a threshold voltage magnitude between the maximum voltage magnitude applied by the operational logical input y0 and the minimum voltage magnitude applied by the operational logical input y0. In this embodiment, the threshold voltage of the operational transmission gate 32-0 is approximately equal to −TNV and thus the threshold voltage has a threshold voltage magnitude |TNV|. The threshold voltage magnitude |TNV| of the threshold voltage is less than the maximum voltage magnitude |VD| that can be applied to the operational transmission gate 32-0 by operational logical input y0.

The operational transmission gate 32-*m* is capable of effecting the threshold logic function because the operational transmission gate 32-*m* determines the particular threshold logic function implemented by the TLE 10 and/or provides a logical variable that determines the result of the threshold logic function implemented by the TLE 10. As shown in FIG. 1, the operational transmission gate 32-*m* is configured to receive a operational logical input ym, which is one of the logical signals in the second set of logical signals. The operational transmission gate 32-*m* is configured such that the threshold logic function assigned to be implemented by the TLE 10, as explained in further detail below. Furthermore, if the operational logical input ym is a Boolean variable rather than a threshold input, the threshold logic function is dependent of the operational logical input ym, as explained in further detail below. Thus, the operational logical input ym may be any type of logical signal including a threshold input or a data input. Accordingly, whether the differential sense amplifier DSA provides the differential logical output DLO in a first differential logical state (e.g., "1/0") or in a second differential logical state (e.g., "0/1") opposite the second differential logical state based partially on the operational logical input ym.

Just like the other logical signals in the second set of logical signals, the operational logical input ym is bounded so that a voltage level of the operational logical input ym has a voltage range between the maximum voltage level (which in this embodiment is approximately the DC voltage level of the supply voltage VD) and the minimum voltage level of (which in this embodiment is approximately ground). As such, a maximum voltage magnitude applied to the operational transmission gate 32-*m* by operational logical input ym is approximately equal to an absolute value of a voltage difference between the maximum voltage level and the minimum voltage level (which in this embodiment is approximately the DC voltage magnitude |VD| of the supply voltage VD). However, the operational transmission gate 32-*m* is configured to define a threshold voltage such that the operational transmission gate 32-*m* is capable of being turned on by the operational logical input ym. More specifically, the operational transmission gate 32-*m* is configured to define the threshold voltage such that the threshold voltage has a threshold voltage magnitude between the maximum voltage magnitude applied by the operational logical input ym and the minimum voltage magnitude applied by the operational logical input ym. In this embodiment, the threshold voltage of the operational transmission gate 32-*m* is approximately equal to −TNV and thus the threshold voltage has a threshold voltage magnitude |TNV|. The threshold voltage magnitude |TNV| of the threshold voltage is less than the maximum voltage magnitude |VD| that can be applied to the operational transmission gate 32-$m$ by operational logical input ym.

In this case, the operational transmission gate 32-$m$ is a FET and in particular a PFET. The operational transmission gate 32-$m$ thus has a drain, a source, and a gate wherein the operational transmission gate 32-$m$ cannot be turned on until a gate to source voltage is approximately equal to or more negative than the threshold voltage −TNV. However, the maximum voltage magnitude |VD| that can be applied by the operational logical input ym between the gate and source of the operational transmission gate 32-$m$ is sufficient to turn on the operational transmission gate 32-$m$ since the threshold voltage magnitude |TNV| of the threshold voltage is less than the maximum voltage magnitude |VD| that can be applied to the operational transmission gate 32-$m$ by operational logical input ym. The operational logical input ym assigned to the operational transmission gate 32-$m$ is explained in further detail below.

In this embodiment, the first input gate network 12 includes a subnetwork 12-O that has the transmission gates 30-O1 through 30-OA and the second input gate network 14 includes a subnetwork 14-O that has the transmission gates 32-O1 through 32-OB. The subset of the transmission gates 30-O1 through 30-OA in the subnetwork 12-O of the first input gate network 12 are all obfuscated transmission gates. The subset of the transmission gates 32-O1 through 32-OB in the subnetwork 14-O of the second input gate network 14 are also all obfuscated transmission gates. An "obfuscated transmission gate" is incapable of effecting the threshold logic function implemented by the TLE 10 and thus cannot be a feedback transmission gate and/or an operational transmission gate. More specifically, an obfuscated transmission gate does not affect the assignment of the particular threshold logic function implemented by the TLE 10, the threshold logic function of the TLE 10 does not depend and is thus independent of the obfuscated transmission gate, and the obfuscated transmission gate does not stabilize the result of the threshold logic function implemented by the TLE 10.

In this embodiment, the obfuscated transmission gates 30-O1 through 30-OA correspond with a set of threshold voltages such that each of the obfuscated transmission gates 30-O1 through 30-OA defines a corresponding one of the set of threshold voltages. The threshold voltage magnitudes of every one of the set of threshold voltages of the obfuscated transmission gates 30-O1 through 30-OA is greater than the threshold voltage magnitudes of every one of the set of threshold voltages of the operational transmission gates 30-O through 30-$n$ so that every one of the obfuscated transmission gates is incapable of effecting the threshold logic function. The obfuscated transmission gates 32-O1 through 32-OB correspond with a set of threshold voltages such that each of the obfuscated transmission gates 32-O1 through 32-OB defines a corresponding one of the set of threshold voltages. The threshold voltage magnitudes of every one of the set of threshold voltages of the obfuscated transmission gates 32-O1 through 32-OA is greater than the threshold voltage magnitudes of every one of the set of threshold voltages of the operational transmission gates 32-O through 32-$m$ so that every one of the obfuscated transmission gates is incapable of effecting the threshold logic function. In this embodiment, each of the obfuscated transmission gates 30-O1 through 30-OA and each of the obfuscated transmission gates 32-O1 through 30-OB are substantially identical. More specifically, the threshold voltages of every one of the obfuscated transmission gates 30-O1 through 30-OA is approximately equal to −HVT. Also, the threshold voltages of every one of the obfuscated transmission gates 32-O1 through 32-OA is approximately equal to −HVT. The threshold voltage magnitude |HVT| is greater than the threshold voltage magnitude |TNV| and the threshold voltage magnitude |HVT| is greater than the maximum voltage magnitude |VD|. Thus, every one of the logical signals in the first set of logical signals and in the second set of logical signals is incapable of turning on any of the obfuscated transmission gates 30-O1 through 30-OA and any of the obfuscated transmission gates 32-O1 through 30-OB.

The obfuscated transmission gate 30-O1 is obfuscated such that the obfuscated transmission gate 30-O1 is incapable of effecting the threshold logic function. As shown in FIG. 1, the obfuscated transmission gate 30-O1 is configured to receive a logical obfuscation input V1, which is one of the logical signals in the first set of logical signals. The obfuscated transmission gate 30-O1 is obfuscated such that the threshold logic function assigned to be implemented by the TLE 10 is independent of the logical obfuscation input V1. In other words, the threshold logic function assigned to the TLE 10 is mutually exclusive to the obfuscated transmission gate 30-O1 or what particular logical signal is assigned to the obfuscated transmission gate 30-O1. Furthermore, the threshold logic function is independent of the logical obfuscation input V1. Thus, the logical obfuscation input V1 may be any type of logical signal including a threshold input or a data input. However, the logical obfuscation input V1 is incapable of operating the obfuscated transmission gate 30-O1. Accordingly, whether the differential sense amplifier DSA provides the differential logical output DLO in a first differential logical state (e.g., "1/0") or in a second differential logical state (e.g., "0/1") opposite the second differential logical state is unrelated to the logical obfuscation input V1.

Just like the other logical signals in the first set of logical signals, the logical obfuscation input V1 is bounded so that a voltage level of the logical obfuscation input V1 has a voltage range between the maximum voltage level (which in this embodiment is approximately the DC voltage level of the supply voltage VD) and the minimum voltage level of (which in this embodiment is approximately ground). As such, a maximum voltage magnitude applied to the obfuscated transmission gate 30-O1 by logical obfuscation input V1 is approximately equal to an absolute value of a voltage difference between the maximum voltage level and the minimum voltage level (which in this embodiment is approximately the DC voltage magnitude |VD| of the supply voltage VD). However, the obfuscated transmission gate 30-O1 is configured to define a threshold voltage such that the obfuscated transmission gate 30-O1 is incapable of being turned on by the logical obfuscation input V1. More specifically, the obfuscated transmission gate 30-O1 is configured to define the threshold voltage such that the threshold voltage has a threshold voltage magnitude greater than the maximum voltage magnitude applied by the logical obfuscation input V1. In this embodiment, the threshold voltage of the obfuscated transmission gate 30-O1 is approximately equal to −HVT and thus the threshold voltage has a threshold voltage magnitude |HVT|. The threshold voltage magnitude |HVT| of the threshold voltage is greater than the maximum voltage magnitude |VD| that can be applied to the obfuscated transmission gate 30-O1 by logical obfuscation input V1.

In this case, the obfuscated transmission gate 30-O1 is a FET and in particular a PFET. The obfuscated transmission gate 30-O1 thus has a drain, a source, and a gate wherein the obfuscated transmission gate 30-O1 cannot be turned on until a gate to source voltage is approximately equal to or more negative than the threshold voltage −HVT. Nevertheless, the maximum voltage magnitude |VD| that can be applied by the logical obfuscation input V1 between the gate and source of the obfuscated transmission gate 30-O1 is always insufficient to turn on the obfuscated transmission gate 30-O1 regardless of what logical signal is selected to be the logical obfuscation input V1.

In some implementations, the logical signal provided as the logical obfuscation input V1 is selected at random. For example, the logical obfuscation input V1 may represent the same threshold input or data input as any one of the logical operational signals x0-xn, y0-ym. Since the maximum voltage magnitudes of the operational logical inputs x0-xn, y0-ym are all approximately equal to that the absolute value of the voltage difference between the maximum voltage level and the minimum voltage level (which in this embodiment is approximately the DC voltage magnitude |VD| of the supply voltage VD), the threshold voltage magnitude |HVT| of the threshold voltage is greater than every one of the voltage magnitudes of the operational logical inputs x0-xn, y0-ym. As such, none of the operational logical inputs x0-xn, y0-ym would be capable of turning on the obfuscated transmission gate 30-O1 and thus the logical obfuscation input V1 could be identical to any one of the operational logical inputs x0-xn, y0-ym and not effect the threshold logic function implemented by the TLE 10. A pirate would have to measure the threshold voltage of the obfuscated transmission gate 30-O1 to determine that the threshold logic function is independent of the obfuscated transmission gate 30-O1.

The obfuscated transmission gate 30-OA is obfuscated such that the obfuscated transmission gate 30-OA is incapable of effecting the threshold logic function. As shown in FIG. 1, the obfuscated transmission gate 30-OA is configured to receive a logical obfuscation input VA, which is one of the logical signals in the first set of logical signals. The obfuscated transmission gate 30-OA is obfuscated such that the threshold logic function assigned to be implemented by the TLE 10 is independent of the logical obfuscation input VA. In other words, the threshold logic function assigned to the TLE 10 is mutually exclusive to the obfuscated transmission gate 30-OA or what particular logical signal is assigned to the obfuscated transmission gate 30-OA. Furthermore, the threshold logic function is independent of the logical obfuscation input VA. Thus, the logical obfuscation input VA may be any type of logical signal including a threshold input or a data input. However, the logical obfuscation input VA is incapable of operating the obfuscated transmission gate 30-OA. Accordingly, whether the differential sense amplifier DSA provides the differential logical output DLO in a first differential logical state (e.g., "1/0") or in a second differential logical state (e.g., "0/1") opposite the second differential logical state is unrelated to the logical obfuscation input VA.

Just like the other logical signals in the first set of logical signals, the logical obfuscation input VA is bounded so that a voltage level of the logical obfuscation input VA has a voltage range between the maximum voltage level (which in this embodiment is approximately the DC voltage level of the supply voltage VD) and the minimum voltage level of (which in this embodiment is approximately ground). As such, a maximum voltage magnitude applied to the obfuscated transmission gate 30-OA by logical obfuscation input VA is approximately equal to an absolute value of a voltage difference between the maximum voltage level and the minimum voltage level (which in this embodiment is approximately the DC voltage magnitude |VD| of the supply voltage VD). However, the obfuscated transmission gate 30-OA is configured to define a threshold voltage such that the obfuscated transmission gate 30-OA is incapable of being turned on by the logical obfuscation input VA. More specifically, the obfuscated transmission gate 30-OA is configured to define the threshold voltage such that the threshold voltage has a threshold voltage magnitude greater than the maximum voltage magnitude applied by the logical obfuscation input VA. In this embodiment, the threshold voltage of the obfuscated transmission gate 30-OA is approximately equal to −HVT and thus the threshold voltage has a threshold voltage magnitude |HVT|. The threshold voltage magnitude |HVT| of the threshold voltage is greater than the maximum voltage magnitude |VD| that can be applied to the obfuscated transmission gate 30-OA by logical obfuscation input VA.

In this case, the obfuscated transmission gate 30-OA is a FET and in particular a PFET. The obfuscated transmission gate 30-OA thus has a drain, a source, and a gate wherein the obfuscated transmission gate 30-OA cannot be turned on until a gate to source voltage is approximately equal to or more negative than the threshold voltage −HVT. Nevertheless, the maximum voltage magnitude |VD| that can be applied by the logical obfuscation input VA between the gate and source of the obfuscated transmission gate 30-OA is always insufficient to turn on the obfuscated transmission gate 30-OA regardless of what logical signal is selected to be the logical obfuscation input VA.

In some implementation, the logical signal provided as the logical obfuscation input VA is selected at random. For example, the logical obfuscation input VA may represent the same threshold input or data input as any one of the logical operational signals x0-xn, y0-ym. Since the maximum voltage magnitudes of the operational logical inputs x0-xn, y0-ym are all approximately equal to that the absolute value of the voltage difference between the maximum voltage level and the minimum voltage level (which in this embodiment is approximately the DC voltage magnitude |VD| of the supply voltage VD), the threshold voltage magnitude |HVT| of the threshold voltage is greater than every one of the voltage magnitudes of the operational logical inputs x0-xn, y0-ym. As such, none of the operational logical inputs x0-xn, y0-ym would be capable of turning on the obfuscated transmission gate 30-OA and thus the logical obfuscation input VA could be identical to any one of the operational logical inputs x0-xn, y0-ym and not effect the threshold logic function implemented by the TLE 10. A pirate would have to measure the threshold voltage of the obfuscated transmission gate 30-OA to determine that the threshold logic function is independent of the obfuscated transmission gate 30-OA.

The obfuscated transmission gate 32-O1 is obfuscated such that the obfuscated transmission gate 32-O1 is incapable of effecting the threshold logic function. As shown in FIG. 1, the obfuscated transmission gate 32-O1 is configured to receive a logical obfuscation input W1, which is one of the logical signals in the second set of logical signals. The obfuscated transmission gate 32-O1 is obfuscated such that the threshold logic function assigned to be implemented by the TLE 10 is independent of the logical obfuscation input W1. In other words, the threshold logic function assigned to the TLE 10 is mutually exclusive to the obfuscated transmission gate 32-O1 or what particular logical signal is assigned to the obfuscated transmission gate 32-O1. Furthermore, the threshold logic function is independent of the logical obfuscation input W1. Thus, the logical obfuscation input W1 may be any type of logical signal including a threshold input or a data input. However, the logical obfuscation input W1 is incapable of operating the obfuscated transmission gate 32-O1. Accordingly, whether the differential sense amplifier DSA provides the differential logical output DLO in a first differential logical state (e.g., "1/0") or in a second differential logical state (e.g., "0/1") opposite the second differential logical state is unrelated to the logical obfuscation input W1.

Just like the other logical signals in the second set of logical signals, the logical obfuscation input W1 is bounded so that a voltage level of the logical obfuscation input W1 has a voltage range between the maximum voltage level (which in this embodiment is approximately the DC voltage level of the supply voltage VD) and the minimum voltage level of (which in this embodiment is approximately ground). As such, a maximum voltage magnitude applied to the obfuscated transmission gate 32-O1 by logical obfuscation input W1 is approximately equal to an absolute value of a voltage difference between the maximum voltage level and the minimum voltage level (which in this embodiment is approximately the DC voltage magnitude |VD| of the supply voltage VD). However, the obfuscated transmission gate 32-O1 is configured to define a threshold voltage such that the obfuscated transmission gate 32-O1 is incapable of being turned on by the logical obfuscation input W1. More specifically, the obfuscated transmission gate 32-O1 is configured to define the threshold voltage such that the threshold voltage has a threshold voltage magnitude greater than the maximum voltage magnitude applied by the logical obfuscation input W1. In this embodiment, the threshold voltage of the obfuscated transmission gate 32-O1 is approximately equal to −HVT and thus the threshold voltage has a threshold voltage magnitude |HVT|. The threshold voltage magnitude |HVT| of the threshold voltage is greater than the maximum voltage magnitude |VD| that can be applied to the obfuscated transmission gate 32-O1 by logical obfuscation input W1.

In this case, the obfuscated transmission gate 32-O1 is a FET and in particular a PFET. The obfuscated transmission gate 32-O1 thus has a drain, a source, and a gate wherein the obfuscated transmission gate 32-O1 cannot be turned on until a gate to source voltage is approximately equal to or more negative than the threshold voltage −HVT. Nevertheless, the maximum voltage magnitude |VD| that can be applied by the logical obfuscation input W1 between the gate and source of the obfuscated transmission gate 32-O1 is always insufficient to turn on the obfuscated transmission gate 32-O1 regardless of what logical signal is selected to be the logical obfuscation input W1.

In some implementations, the logical signal provided as the logical obfuscation input W1 is selected at random. For example, the logical obfuscation input W1 may represent the same threshold input or data input as any one of the logical operational signals x0-xn, y0-ym. Since the maximum voltage magnitudes of the operational logical inputs x0-xn, y0-ym are all approximately equal to that the absolute value of the voltage difference between the maximum voltage level and the minimum voltage level (which in this embodiment is approximately the DC voltage magnitude |VD| of the supply voltage VD), the threshold voltage magnitude |HVT| of the threshold voltage is greater than every one of the voltage magnitudes of the operational logical inputs x0-xn, y0-ym. As such, none of the operational logical inputs x0-xn, y0-ym would be capable of turning on the obfuscated transmission gate 32-O1 and thus the logical obfuscation input W1 could be identical to any one of the operational logical inputs x0-xn, y0-ym and not effect the threshold logic function implemented by the TLE 10. A pirate would have to measure the threshold voltage of the obfuscated transmission gate 32-O1 to determine that the threshold logic function is independent of the obfuscated transmission gate 32-O1.

The obfuscated transmission gate 32-OB is obfuscated such that the obfuscated transmission gate 32-OB is incapable of effecting the threshold logic function. As shown in FIG. 1, the obfuscated transmission gate 32-OB is configured to receive a logical obfuscation input WB, which is one of the logical signals in the second set of logical signals. The obfuscated transmission gate 32-OB is obfuscated such that the threshold logic function assigned to be implemented by the TLE 10 is independent of the logical obfuscation input WB. In other words, the threshold logic function assigned to the TLE 10 is mutually exclusive to the obfuscated transmission gate 32-OB or what particular logical signal is assigned to the obfuscated transmission gate 32-OB. Furthermore, the threshold logic function is independent of the logical obfuscation input WB. Thus, the logical obfuscation input WB may be any type of logical signal including a threshold input or a data input. However, the logical obfuscation input WB is incapable of operating the obfuscated transmission gate 32-OB. Accordingly, whether the differential sense amplifier DSA provides the differential logical output DLO in a first differential logical state (e.g., "1/0") or in a second differential logical state (e.g., "0/1") opposite the second differential logical state is unrelated to the logical obfuscation input WB.

Just like the other logical signals in the second set of logical signals, the logical obfuscation input WB is bounded so that a voltage level of the logical obfuscation input WB has a voltage range between the maximum voltage level (which in this embodiment is approximately the DC voltage level of the supply voltage VD) and the minimum voltage level of (which in this embodiment is approximately ground). As such, a maximum voltage magnitude applied to the obfuscated transmission gate 32-OB by logical obfuscation input WB is approximately equal to an absolute value of a voltage difference between the maximum voltage level and the minimum voltage level (which in this embodiment is approximately the DC voltage magnitude |VD| of the supply voltage VD). However, the obfuscated transmission gate 32-OB is configured to define a threshold voltage such that the obfuscated transmission gate 32-OB is incapable of being turned on by the logical obfuscation input WB. More specifically, the obfuscated transmission gate 32-OB is configured to define the threshold voltage such that the threshold voltage has a threshold voltage magnitude greater than the maximum voltage magnitude applied by the logical obfuscation input WB. In this embodiment, the threshold voltage of the obfuscated transmission gate 32-OB is approximately equal to −HVT and thus the threshold voltage has a threshold voltage magnitude |HVT|. The threshold voltage magnitude |HVT| of the threshold voltage is greater than the maximum voltage magnitude |VD| that can be applied to the obfuscated transmission gate 32-OB by logical obfuscation input WB.

In this case, the obfuscated transmission gate 32-OB is a FET and in particular a PFET. The obfuscated transmission gate 32-OB thus has a drain, a source, and a gate wherein the obfuscated transmission gate 32-OB cannot be turned on until a gate to source voltage is approximately equal to or more negative than the threshold voltage −HVT. Nevertheless, the maximum voltage magnitude |VD| that can be applied by the logical obfuscation input WB between the gate and source of the obfuscated transmission gate 32-OB is always insufficient to turn on the obfuscated transmission gate 32-OB regardless of what logical signal is selected to be the logical obfuscation input WB.

In some implementation, the logical signal provided as the logical obfuscation input WB is selected at random. For example, the logical obfuscation input WB may represent the same threshold input or data input as any one of the logical operational signals x0-xn, y0-ym. Since the maximum voltage magnitudes of the operational logical inputs x0-xn, y0-ym are all approximately equal to that the absolute value of the voltage difference between the maximum voltage level and the minimum voltage level (which in this embodiment is approximately the DC voltage magnitude |VD| of the supply voltage VD), the threshold voltage magnitude |HVT| of the threshold voltage is greater than every one of the voltage magnitudes of the operational logical inputs x0-xn, y0-ym. As such, none of the operational logical inputs x0-xn, y0-ym would be capable of turning on the obfuscated transmission gate 32-OB and thus the logical obfuscation input WB could be identical to any one of the operational logical inputs x0-xn, y0-ym and not effect the threshold logic function implemented by the TLE 10. A pirate would have to measure the threshold voltage of the obfuscated transmission gate 32-OB to determine that the threshold logic function is independent of the obfuscated transmission gate 32-OB.

In this embodiment, the transmission gates 30-N1 of the first input gate network 12 and the transmission gate 32-N2 of the second input gate network 14 are each feedback transmission gates. A "feedback transmission gate" is a transmission gate configured to help stabilize the result of the threshold logic function implemented by the TLE 10. The feedback transmission gate 30-N1 is capable of effecting the threshold logic function because the feedback transmission gate 30-N1 stabilizes the result of the threshold logic function implemented by the TLE 10. In this embodiment, the feedback transmission gate 30-N1 and the feedback transmission gate 32-N2 are identical to the operational transmission gates 30-O through 30-$n$ and the operational transmission gates 32-0 through 32-$m$.

As shown in FIG. 1, the feedback transmission gate 30-N1 is configured to receive a logical output N1, which is one of the logical signals in the first set of logical signals. In this embodiment, the logical output N1 represents a Boolean variable that is output as a result of the threshold logic function implemented by the TLE 10, as explained in further detail below. Accordingly, the differential logical output DLO is stabilized in a first differential logical state (e.g., "1/0") or in a second differential logical state (e.g., "0/1") opposite the second differential logical state based partially on the logical output N1.

Just like the other logical signals in the first set of logical signals, the logical output N1 is bounded so that a voltage level of the logical output N1 has a voltage range between the maximum voltage level (which in this embodiment is approximately the DC voltage level of the supply voltage VD) and the minimum voltage level of (which in this embodiment is approximately ground). As such, a maximum voltage magnitude applied to the feedback transmission gate 30-N1 by logical output N1 is approximately equal to an absolute value of a voltage difference between the maximum voltage level and the minimum voltage level (which in this embodiment is approximately the DC voltage magnitude |VD| of the supply voltage VD). However, the feedback transmission gate 30-N1 is configured to define a threshold voltage such that the feedback transmission gate 30-N1 is capable of being turned on by the logical output N1. More specifically, the feedback transmission gate 30-N1 is configured to define the threshold voltage such that the threshold voltage has a threshold voltage magnitude between the maximum voltage magnitude applied by the logical output N1 and the minimum voltage magnitude applied by the logical output N1. In this embodiment, the threshold voltage of the feedback transmission gate 30-N1 is approximately equal to −TNV and thus the threshold voltage has a threshold voltage magnitude |TNV|. The threshold voltage magnitude |TNV| of the threshold voltage is less than the maximum voltage magnitude |VD| that can be applied to the feedback transmission gate 30-N1 by logical output N1.

In this case, the feedback transmission gate 30-N1 is a FET and in particular a PFET. The feedback transmission gate 30-N1 thus has a drain, a source, and a gate wherein the feedback transmission gate 30-N1 cannot be turned on until a gate to source voltage is approximately equal to or more negative than the threshold voltage −TNV. However, the maximum voltage magnitude |VD| that can be applied by the logical output N1 between the gate and source of the feedback transmission gate 30-N1 is sufficient to turn on the feedback transmission gate 30-N1 since the threshold voltage magnitude |TNV| of the threshold voltage is less than the maximum voltage magnitude |VD| that can be applied to the feedback transmission gate 30-N1 by logical output N1.

The feedback transmission gate 32-N2 is capable of effecting the threshold logic function because the feedback transmission gate 32-N2 stabilizes the result of the threshold logic function implemented by the TLE 10. As shown in FIG. 1, the feedback transmission gate 32-N2 is configured to receive a logical output N2, which is one of the logical signals in the second set of logical signals. In this embodiment, the logical output N2 represents a Boolean variable that is output as a result of the threshold logic function implemented by the TLE 10, as explained in further detail below. Accordingly, the differential logical output DLO is stabilized in a first differential logical state (e.g., "1/0") or in a second differential logical state (e.g., "0/1") opposite the second differential logical state based partially on the logical output N2.

Just like the other logical signals in the second set of logical signals, the logical output N2 is bounded so that a voltage level of the logical output N2 has a voltage range between the maximum voltage level (which in this embodiment is approximately the DC voltage level of the supply voltage VD) and the minimum voltage level of (which in this embodiment is approximately ground). As such, a maximum voltage magnitude applied to the feedback transmission gate 32-N2 by logical output N2 is approximately equal to an absolute value of a voltage difference between the maximum voltage level and the minimum voltage level (which in this embodiment is approximately the DC voltage magnitude |VD| of the supply voltage VD). However, the feedback transmission gate 32-N2 is configured to define a threshold voltage such that the feedback transmission gate 32-N2 is capable of being turned on by the logical output N2. More specifically, the feedback transmission gate 32-N2 is configured to define the threshold voltage such that the threshold voltage has a threshold voltage magnitude between the maximum voltage magnitude applied by the logical output N2 and the minimum voltage magnitude applied by the logical output N2. In this embodiment, the threshold voltage of the feedback transmission gate 32-N2 is approximately equal to −TNV and thus the threshold voltage has a threshold voltage magnitude |TNV|. The threshold voltage magnitude |TNV| of the threshold voltage is less than the maximum voltage magnitude |VD| that can be applied to the feedback transmission gate 32-N2 by logical output N2.

In this case, the feedback transmission gate 32-N2 is a FET and in particular a PFET. The feedback transmission gate 32-N2 thus has a drain, a source, and a gate wherein the feedback transmission gate 32-N2 cannot be turned on until a gate to source voltage is approximately equal to or more negative than the threshold voltage −TNV. However, the maximum voltage magnitude |VD| that can be applied by the logical output N2 between the gate and source of the feedback transmission gate 32-N2 is sufficient to turn on the feedback transmission gate 32-N2 since the threshold voltage magnitude |TNV| of the threshold voltage is less than the maximum voltage magnitude |VD| that can be applied to the feedback transmission gate 32-N2 by logical output N2.

As mentioned above, the differential sense amplifier DSA is configured to feed back the differential logical output DLO generated by the differential sense amplifier DSA to the first input gate network 12 and the second input gate network 14. By providing the differential logical output DLO as feedback to the first input gate network 12 and the second input gate network 14, the differential logical output DLO is prevented from floating and thus helps prevent coupling noise from causing errors in the logical outputs N1, N2. This thus helps stabilizes the result of the threshold logic function and prevents the logical output Q and the inverted logical output Q' from being provided in an incorrect logical state. Also if a clock period of the non-inverted clock signal CLK and the inverted clock signal CLK' is long enough to result in charge leaks at the isolated control node 22 and the isolated control node 24, feeding back the differential logical output DLO generated by the differential sense amplifier DSA to the first input gate network 12 and the second input gate network 14 helps prevent these charge leaks by driving the isolated control nodes 22, 24 during the clock cycle.

Accordingly, a pirate would have to measure the threshold voltage of the obfuscated transmission gates 30-O1 to 30-OA and the obfuscated transmission gates 32-O1 to 32-OB to determine that the threshold logic function is independent of the logical obfuscation inputs V1-VA, W1-WB. This is extremely difficult as automated reverse engineering techniques are not currently capable of making these distinctions and would rather require measurements and observations of a human engineer. Even if the human engineer knew that some of the transmission gates were obfuscated determining which logical inputs were operational and which were for obfuscation would be extremely time consuming and tedious work. Given the size and number of components in modern ICs, human engineers simply could not reverse engineer the IC in any manner considered remotely cost effective. Furthermore, adding obfuscated transmission gates, such as the obfuscated transmission gates 30-O1 to 30-OA and the obfuscated transmission gates 32-O1 to 32-OB, consumes a very small area and very little power in comparison to obfuscation techniques utilized with Boolean logic gates. As such, the TLE 10 can provide obfuscation without greatly increasing the size or power consumption of the TLE 10.

With regards to signal assignment for the operational transmission gates 30-0 through 30-$n$ and 32-0 through 32-$m$, there are various signal assignment techniques that may be used to implement a threshold logic function with the TLE 10 shown in FIG. 1. Threshold logic functions are a proper subset of unate functions. Without loss of generality, we can assume that they are also positive, i.e., all the weights are positive integers. The TLE 10 can be configured to realize a given positive threshold logic function f(z0, z1, . . . , zt), where z0-zt (referred to generically as elements z) are each Boolean inputs. The signal assignment techniques are techniques for providing the Boolean inputs z and complements (referred to specifically as elements z0'-zt' or generically as elements z') of the Boolean inputs z to the appropriate transmission gates 30, 32 in the first input gate network 12 and the second input gate network 14. There are many possible ways to do this assignment, and the implementation of the TLE 10 is not restricted to any particular one. However, the specific signal assignment technique described herein is viewed as having an n+1 number of bit inputs. In this example, the number n is also considered to be equal to m so that the number of transmission gates in the first input gate network 12 and the number of transmission gates in the second input gate network 14 are equal. The second set of operational logical inputs y of the transmission gates 32 in the second input gate network 14 will be driven by bit inputs (which include the Boolean inputs z) while the first set of operational logical inputs x of the transmission gates 30 of the first input gate network 12 will be driven by complements of the bit inputs (which include the complement Boolean inputs z'). This signal assignment is referred to as complementary signal assignment (CSA).

To ensure that the number of transmission gates 30, 32 activated in the first input gate network 12 and the second input gate network 14 are never equal, n+1 is odd. This is because if the n+1 number were even, and if an r number were active in the first input gate network 12, then n+1−r would be active in the second input gate network 14. Hence if r=n+1, an equal number of transistors would be active in the first input gate network 12 and second input gate network 14. Since the differential sense amplifier DSA shown in FIG. 1 needs an unequal number of transmission gates to implement the threshold logic function, the number of transmission gates in the first input gate network 12 and the number of transmission gates in the second input gate network 14 are each odd and greater than 1. Since the first input gate network 12 and second input gate network 14 are complementary, for the logical outputs N1 to be 0, just over half (or more) of the transmission gates 30 in the first input gate network 12 must be active. Hence with the number of transmission gates in the first input gate network 12 and the number of transmission gates in the second input gate network 14 each being odd, the TLE 10 with this signal assignment (all transmission gates 30 driven by a distinct and corresponding one of the operational logical inputs x), implements the threshold function defined by:

Equation 1:

$$x0+x1+ \ldots +xn >= (n+2)/2 \qquad (1)$$

Consider the generic threshold logic function f(z0, z1, . . . , zt) defined by W1*z0+w1*z1+ . . . +wt*zt>=T that is to be realized by the TLE 10. Clearly if T>(n+2)=2, then the function f cannot be implemented by TLE 10, given the above mentioned assumptions. Hence T>(n+2)/2. Let D=(n+2)/2−T and W=the summation of the weights W1 through wt. In order to see how bit signals can be mapped to the operational logical inputs x, y of the TLE 10 to realize f(z0; z0; . . . ; zt), z should be replicated w times for 1<=i<=m in the definition of f.

Equation 2:

$$x0 \ldots +xj+xd \ldots +xk \ldots +xq \ldots +xl >= T \qquad (2)$$

In equation 2, each of the operational logical inputs x0 through xj is assigned the same Boolean input z0 so as to equal W1*z0, each of the operational logical inputs xd to xk is assigned the Boolean input z1 to equal w1*z1, . . . , and each of the operational logical inputs xq to xl is assigned to the logical value zt to equal wt*zt.

Given equations 1 and 2, the second condition on the TLE 10 to be able to realize f(z1; z2; . . . ; zt) is W+D>=n+1, or W−T<=(n)/2, given the TLE 10 where n number of transmission gates 30, 32. As such, equation 2 can be represented as:

Equation 3:

$$x1 \ldots +xj+xd \ldots +xk \ldots +xq \ldots +xl+D>=(n+2)/2 \quad (3)$$

Since the first set of operational logical inputs x are set to complements, the first set and the second set of the operational logical inputs x, y are assigned as follows: (1) D number of the operational logical inputs y are assigned a logical "1" for each of the Boolean inputs z, (2) w number of the operational logical inputs y are assigned to represent the same Boolean input z, (3) any remaining operational logical inputs y are assigned to a logical "0", and (4) each of the operational logical inputs x is assigned to be a CSA of one of the operational logical inputs y. Thus, the first set of operational logical inputs x are thus provided to the first input gate network 12 as the complement of the second set of operational logical inputs y to the second input gate network 14. The sequential state element 20 is configured to perform an SR latching operation in accordance with the differential logical output DLO to generate the logical output Q and the inverted logical output Q'.

Figure 2:
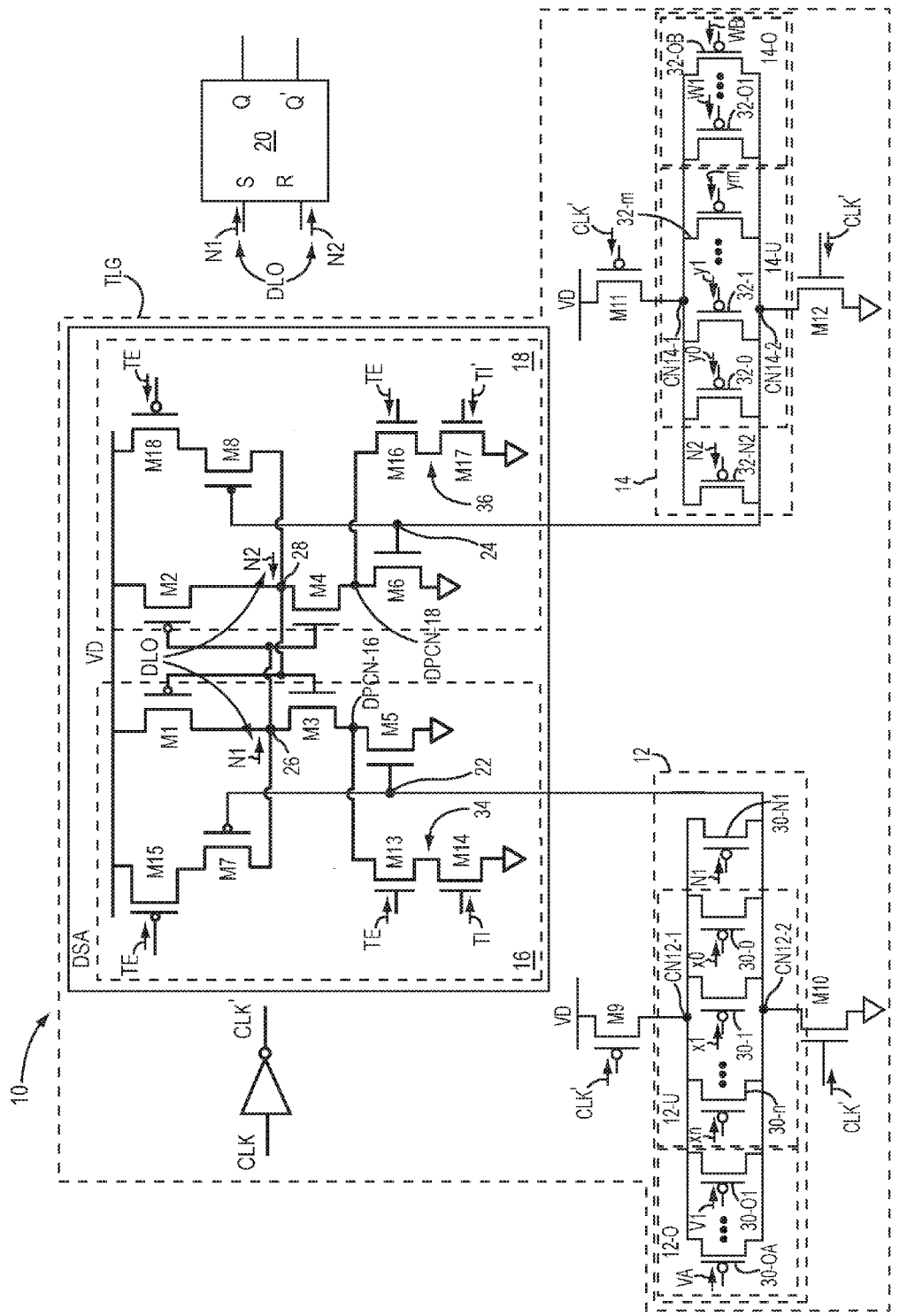
FIG. 2 illustrates another embodiment of the threshold logic element with obfuscated transmission gates and which is configured to provide scan mode functionality.

FIG. 2 illustrates another embodiment of the TLE 10. The TLE 10 includes the same embodiments of the first input gate network 12, the second input gate network 14, and the sequential state element 20 described above in FIG. 1. However, the TLE 10 includes another embodiment of the differential sense amplifier DSA. The differential sense amplifier DSA shown in FIG. 2 is similar to the differential sense amplifier DSA shown in FIG. 1. More specifically, the differential sense amplifier DSA shown in FIG. 2 includes another embodiment of the first amplifier branch 16 (i.e., the first NAND gate) having the transistors M1, M3, M5, M7, the isolated control node 22, and the output node 26, which all operate in the same manner described above with respect to FIG. 1 during the reset state and the evaluation state. Furthermore, the differential sense amplifier DSA shown in FIG. 2 includes another embodiment of the second amplifier branch 18 (i.e., the second NAND gate) having the transistors M2, M4, M6, M8, the isolated control node 24, and the output node 28, which all operate in the same manner described above with respect to FIG. 1 during the reset state and the evaluation state. However, in this embodiment, the differential sense amplifier DSA shown in FIG. 2 is configured to provide scan functionality so that the TLE 10 can be tested during a scan mode when provided in an IC.

To provide scan functionality during a scan mode, the first amplifier branch 16 shown in FIG. 2 includes the transistor M13, the transistor M14, and the transistor M15 while the second amplifier branch 18 includes a transistor M16, a transistor M17, and a transistor M18. With respect to the first amplifier branch 16, each of the transistors M13, M14 is a NFET. The transistor M13 and the transistor M14 are stacked to form a discharge path 34 configured to be opened and closed. The discharge path 34 is operably associated with the output node 26 so that the output node 26 is discharged through the discharge path 34 when the discharge path 34 is closed. The discharge path 34 is opened and closed in accordance with a test enable input TE and a test operational logical input TI in order to operate scan functionality. In this embodiment, a drain of the transistor M13 is coupled to the source of the transistor M3 and the drain of the transistor M5 at a discharge path connection node DPCN-16. A source of the transistor M13 is coupled to a drain of the transistor M14. A gate of the transistor M13 is configured to receive the test enable input TE. Furthermore, a source of the transistor M14 is coupled to ground while a gate of the transistor M14 is configured to receive the test operational logical input TI. The discharge path 34 therefore provides a shunt path between the discharge path connection node DPCN-16 to ground that is configured to be opened and closed in accordance with the test enable input TE and the test operational logical input TI.

Furthermore, the first amplifier branch 16 includes the transistor M15, which is a PFET. In this embodiment, the source of the transistor M7 is coupled to a drain of the transistor M15. A source of the transistor M15 is configured to receive the supply voltage VD, while a gate of the transistor M15 is configured to receive the test enable input TE. Thus, the transistor M15 is activated and deactivated in accordance with the test enable input TE. As such, the first amplifier branch 16 is configured to switch between enabling and disabling the first input gate network 12 from charging the isolated control node 22.

With respect to the second amplifier branch 18, each of the transistors M16, M17 is a NFET. The transistor M16 and the transistor M17 are stacked to form a discharge path 36 configured to be opened and closed. The discharge path is operably associated with the output node 28 so that the output node 28 is discharged through the discharge path 36 when the discharge path 36 is closed. The discharge path 36 is opened and closed in accordance with the test enable input TE and an inverted test operational logical input TI' in order to operate scan functionality. The inverted test operational logical input TI' is inverted with respect to the test operational logical input TI. In this embodiment, a drain of the transistor M16 is coupled to the source of the transistor M4 and the drain of the transistor M6 at a discharge path connection node DPCN-18. A source of the transistor M16 is coupled to a drain of the transistor M17. A gate of the transistor M16 is configured to receive the test enable input TE. Furthermore, a source of the transistor M17 is coupled to ground while a gate of the transistor M17 is configured to receive the test operational logical input TI. The discharge path 36 therefore provides a shunt path between the discharge path connection node DPCN-18 to ground that is configured to be opened and closed in accordance with the test enable input TE and the test operational logical input TI.

Furthermore, the second amplifier branch 18 includes the transistor M18, which is a PFET. In this embodiment, the source of the transistor M8 is coupled to a drain of the transistor M18. A source of the transistor M18 is configured to receive the supply voltage VD, while a gate of the transistor M18 is configured to receive the test enable input TE. Thus, the transistor M18 is activated and deactivated in accordance with the test enable input TE. As such, the second amplifier branch 18 is configured to switch between enabling and disabling the second input gate network 14 from charging the isolated control node 24.

During a normal operating mode, the test enable input TE and the test operational logical input TI are each provided at logic "0." Also, during the normal operating mode, the test operational logical input TI is provided at logic "0," and the inverted test operational logical input TI' is provided at logic "1." Thus while the TLE 10 shown in FIG. 2 is operating in the normal mode, the TLE 10 shown in FIG. 2 operates in the same manner as the TLE 10 shown in FIG. 1 during both the reset state and the evaluation state in accordance with the non-inverted clock signal CLK and the inverted clock signal CLK'. As such, in the normal operating mode, the discharge path 34 and the discharge path 36 are each open. This is because the transistor M13 and the transistor M16 are each deactivated in response to the test enable input TE being provided at logic "0." Furthermore, the first amplifier branch 16 enables the first input gate network 12 to charge the isolated control node 22, while the second amplifier branch 18 enables the second input gate network 14 to charge the isolated control node 24. This is because the transistor M15 and the transistor M18 are both activated in response to the test enable input TE being provided at logic "0."

Additionally, the first amplifier branch 16 enables the first input gate network 12 to charge the isolated control node 22, while the second amplifier branch 18 enables the second input gate network 14 to charge the isolated control node 24. This is because the transistor M15 and the transistor M18 are both activated in response to the test enable input TE being provided at logic "0." Furthermore, since the transistor M15 is activated, the first amplifier branch 16 enables the transmission gate 30-N1 to drive the isolated control node 22 in accordance with the first logical output N1 of the first amplifier branch 16. Since the transistor M18 is activated, the second amplifier branch 18 enables the transmission gate 32-N2 is to drive the isolated control node 24 in accordance with the second logical output N2 of the second amplifier branch 18.

During the scan mode, the differential sense amplifier DSA is configured to close one of the discharge paths 34, 36 and maintain the other one of the discharge paths 36, 34 open based on the test operational logical input TI. As such, in the scan mode and while the test enable input TE is provided at logical "1", the first amplifier branch 16 is configured to close the discharge path 34 if the test operational logical input TI is a logical "1." This is because the transistor M13 is activated in response to the test enable input TE being a logical "1," and the transistor M14 is activated in response to the test operational logical input TI being a logical "1." If the test operational logical input TI is logical "1," the inverted test operational logical input TI' is a logical "0." Accordingly, the second amplifier branch 18 is configured to maintain the discharge path 36 open. This is because the transistor M17 configured to be deactivated by the inverted test operational logical input TI' is a logical "0," and thus the test operational logical input TI is a logical "1."

During the scan mode, the non-inverted clock signal CLK is maintained low at logic "0" while the inverted clock signal is maintained high at logic "1." To test a stream of test bits with the TLE 10 shown in FIG. 2, the test enable input TE is used for synchronization. This allows for chains of TLEs, each of which may be like the TLE 10 shown in FIG. 2 to be connected to provide a scan chain mechanism. A global test input may be provided at an entry point of the TLEs in the scan chain mechanism to set a logical state of the test operational logical input TI. As explained in further detail below, the test enable input TE is utilized for synchronization, and thus both a logical state of the global test input and the test operational logical input TI can be set by one of the test bits during each scan cycle. Scan cycles can be repeated for each of the test bits and thereby provide testing for the stream of test bits.

Referring again to the TLE 10 shown in FIG. 2, a scan cycle begins when the non-inverted clock signal CLK and the test enable input TE are both provided at logical "0" (and thus the inverted clock signal CLK' being provided at a logical "1). A logical state of the test operational logical input TI and a logical state of the inverted operational logical input TI' may then be set as a result of a logical state of the global test input. Next, a logical state of the test enable input TE is set to a logic "1," which indicates the scan mode. The clock signal remains in the logical state "0," and thus the inverted clock signal CLK' remains in the logical state "1."

In the scan mode and while the test enable input TE is provided at logical "1", the second amplifier branch 18 is configured to close the discharge path 36 if the test operational logical input TI is a logical "0." If the test operational logical input TI is logical "0," the inverted test operational logical input TI' is a logical "1." As such, the transistor M16 is activated in response to the test enable input TE being a logical "1," and the transistor M17 is activated in response to the inverted test operational logical input TI' being a logical "1." The first amplifier branch 16 is configured to maintain the discharge path 34 open. This is because the transistor M14 is configured to be deactivated by the test operational logical input TI being a logical "0." Furthermore, the first amplifier branch 16 disables the first input gate network 12 from charging the isolated control node 22 while the second amplifier branch 18 disables the second input gate network 14 from discharging the isolated control node 24. This is because the transistor M15 and the transistor M18 are both deactivated in response to the test enable input TE being provided at logic "1." Therefore, whether the output node 26 discharges during the scan mode depends on whether the discharge path 34 is closed or is maintained open, which is determined by the test operational logical input TI. Furthermore, whether the output node 28 discharges during the scan mode depends on whether the discharge path 36 is closed or is maintained open, which is determined by the test operational logical input TI.

As such, the logical output N1 is provided to be a logical "0" by the first amplifier branch 16, and the logical output N2 is provided by the second amplifier branch 18 as a logical "1" during the scan mode when the test operational logical input TI is provided at a logical "1." Thus, the differential logical output DLO is provided to the sequential state element 20 as differential logic "0/1." The sequential state element 20 thus generates the logical output Q as a logical "1" and the inverted logical output Q' as a logical "0." Additionally, the logical output N1 is provided to be a logical "1" by the first amplifier branch 16, and the logical output N2 is provided by the second amplifier branch 18 as a logical "0" during the scan mode when the test operational logical input TI is provided at a logical "0." Thus, the differential logical output DLO is provided to the sequential state element 20 as differential logic "1/0." The sequential state element 20 thus generates the logical output Q as a logical "0" and the inverted logical output Q' as a logical "1." The test operational logical input TI can now be provided again at a logical "0." If there are more test bits in the stream, the global test input can set in accordance with the next test bit, and the scan cycle can be repeated until all the test bits in the stream have been scanned.

A TLG refers to the portion of the TLE 10 without a sequential state element. FIG. 1 and FIG. 2 thus show the TLG. The TLG performs the threshold logic function and thus in alternative embodiments of a threshold logic element, the threshold logic element may be provided as simply the TLG shown in FIG. 1 or the TLG shown in FIG. 2 without the sequential state element 20.

Figure 3:
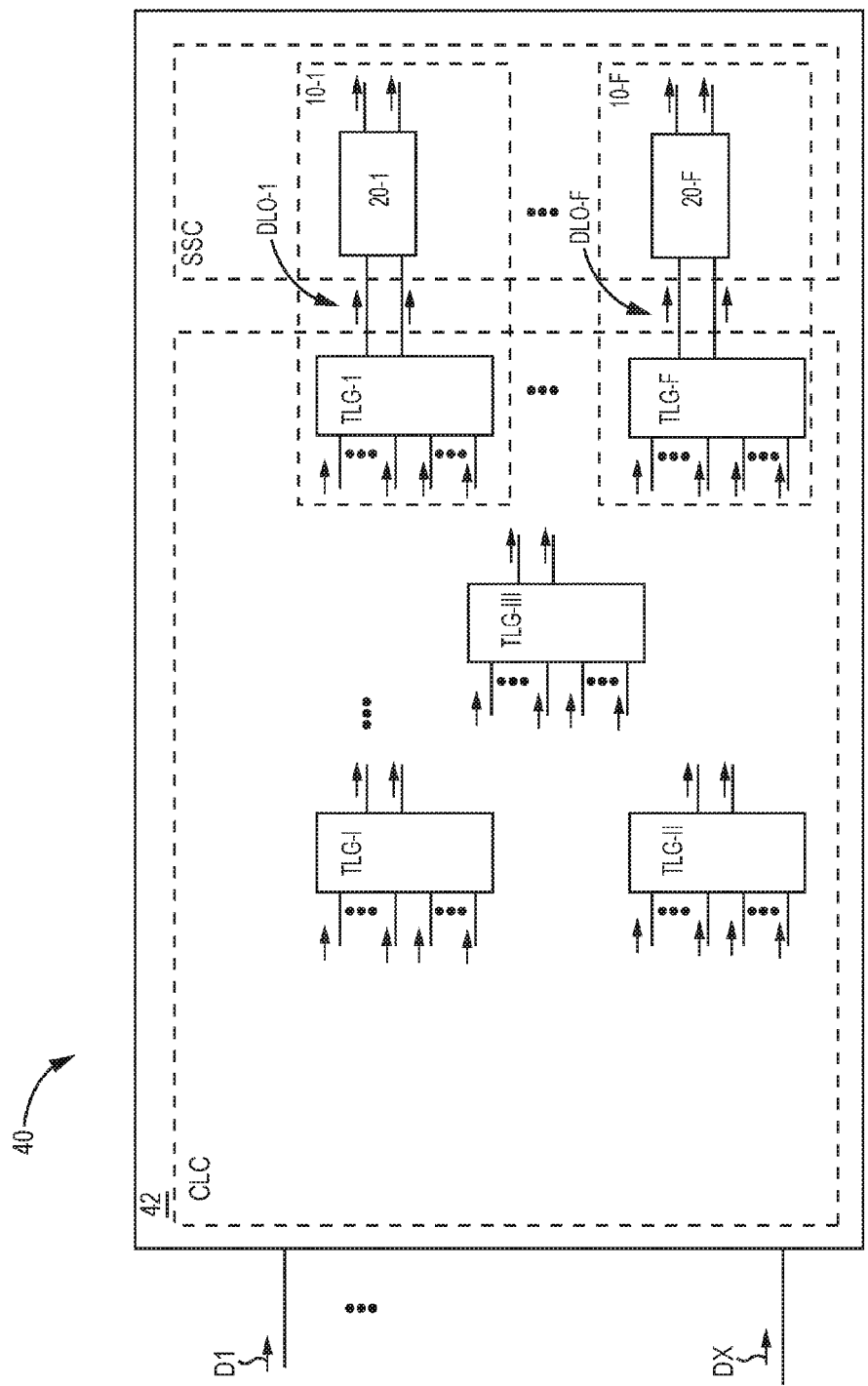
FIG. 3 is a generalized diagram of digital circuitry that utilizes threshold logic elements with obfuscated transmission gates in order to obfuscate the digital functionality of the digital circuitry.

Referring now to FIG. 3, FIG. 3 illustrates an embodiment of digital circuitry 40 that includes embodiments of threshold logic elements. In this embodiment, the digital circuitry 40 is a pipeline stage of a finite state machine. The digital circuitry 40 thus includes a combinational logic circuit (CLC) and a sequential state circuit SSC. The CLC of the digital circuitry performs a designated pipeline operation in accordance with its logical arrangement. The CLCs include an arrangement of combinational logic elements configured to provide logic that implements the operation of the CLC. Examples of operations that may be provided by the CLC for the finite state machine include instruction fetch operations, instruction decode operations, encode operations, register file operations, fetch operations, instruction execution operations, data memory access operations, register file write back operations, and/or the like. The CLC is configured to receive a set of data inputs D1 to DX and generate a set of logical outputs, which in this case are differential logical outputs DLO1 to DLOF in accordance with the operation performed by the CLC. In this embodiment, the CLC includes TLGs and may include Boolean logic gates as well. The SSC coordinate transfer of valid logical states between the digital circuitry 40 and the next pipeline stage. In this example, a set of TLEs 10-1 through 10-F are provided where the sequential state elements 20-1 through 20-F of the TLEs 10-1 through 10-F provide the SSC. The TLEs 10-1 through 10-F further include the TLG-1 through TLG-F as the final portion of the CLC. Other TLG, such as TLG-I through TLG-III, are provided within the CLC and are not associated with a sequential state element. The TLEs 10-1 through 10-F and TLG-I through TLG-III are combinational logic elements of the CLC. Other combinational logic elements, such as Boolean logic gates (not explicitly shown), may also be provided to implement the operation of the CLC. The logical outputs of the sequential state elements 20-1 through 20-F of the SSC provide a set of data inputs for the next pipeline stage. The digital circuitry 40 is an IC formed in a semiconductor die 42.

Figure 4:
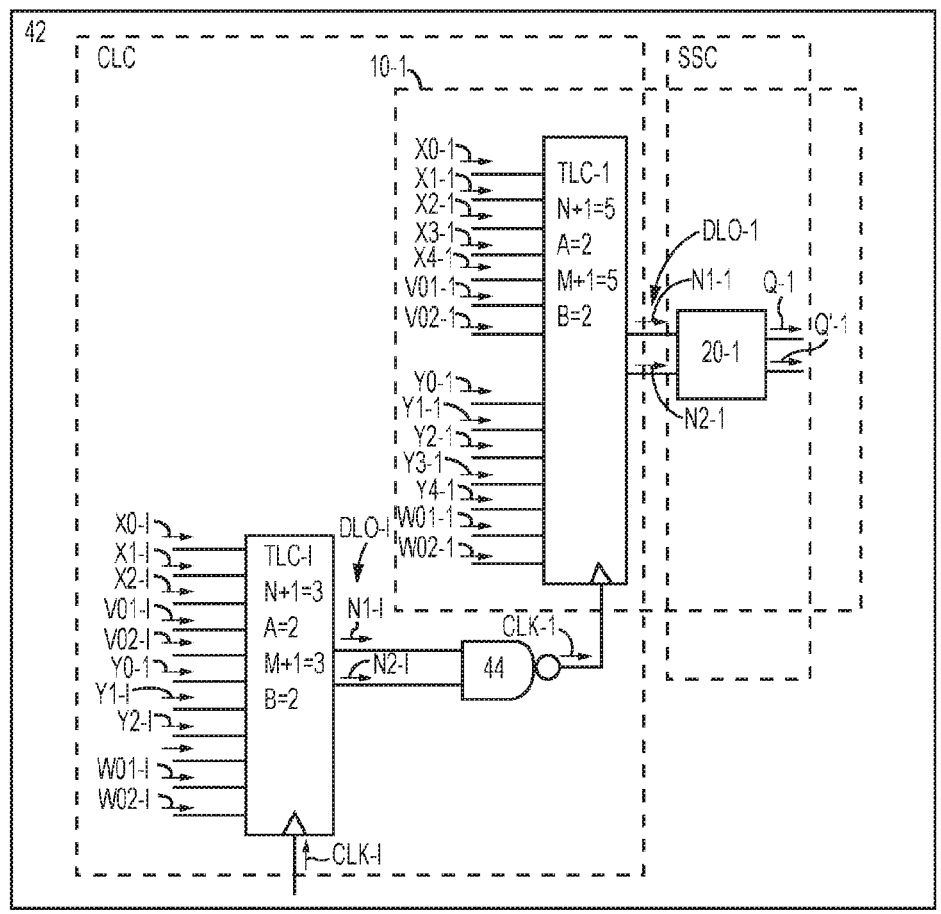
FIG. 4 is an embodiment of the digital circuitry shown in FIG. 3 wherein the digital circuitry in FIG. 4 is arranged to perform a 3-input XOR function.

Referring now to FIG. 4, FIG. 4 illustrates an embodiment of the digital circuitry 40 where the CLC with an embodiment of the TLG-I and an embodiment of the TLG-1. In FIG. 4, the TLG-1 and the TLG-I are each provided in the same manner as the TLG shown in FIG. 1. The TLG-1 is part of the TLE 10-1, which also includes the sequential state element 20-1. The sequential state element 20-1 is included in the SSC. To refer to an embodiment of the TLG that implements a specific threshold logic function, each of the TLGs in FIG. 4 is associated with an integer value for n+1 that indicates the number of operational transmission gates 30-0 to 30-n, an integer value for A that indicates the number of obfuscated transmission gates 30-O1 to 30-OA, an integer value for m+1 that indicates the number of operational transmission gates 32-0 to 32-m, and an integer value for B that indicates the number of obfuscated transmission gates 32-O1 to 32-OB. More specifically, the TLG-I is associated with the integer value n+1=3 and an integer value A=2. Thus, a first set of logical signals for the TLG-I includes operational logical inputs x0-I to x2-I and logical obfuscation inputs VO1-I to VO2-I. Furthermore, the TLG-I is associated with the integer value m+1=3 and an integer value B=2. Thus, a second set of logical signals for the TLG-I includes operational logical inputs y0-I to y2-I and logical obfuscation inputs WO1-I to WO2-I.

The TLG-1 is associated with the integer value n+1=5 and an integer value A=2. Thus, a first set of logical signals for the TLG-1 includes operational logical inputs x0-1 to x4-1 and logical obfuscation inputs VO1-1 to VO2-1. Furthermore, the TLG-1 is associated with the integer value m+1=5 and an integer value B=2. Thus, a second set of logical signals for the TLG-1 includes operational logical inputs y0-1 to y4-1 and logical obfuscation inputs WO1-1 to WO2-1.

As shown in FIG. 4, the CLC also includes a NAND gate 44, which is a Boolean logic gate. The NAND gate 44 receives a logical output N1-I and a logical output N2-I of the DLO-I as logical inputs. The TLG-I is configured to receive a clock signal CLK-I. The NAND gate 44 is configured to generate a clock signal CLK-1 for the TLE 10-1. Accordingly during the reset state for the TLG-I when the clock signal CLK-I is at logic "0", the DLO-I is in the precharge state and thus both the logical output N1-1 and the logical output N2-1 are provided as logical "1." In response, the NAND gate 44 generates the clock signal CLK-1 to be at logic "0." However, during the evaluation state of the TLG-I when the clock signal CLK-I is logic "1", the DLO-1 is provided in one of the differential logical states and thus the logical output N1-I and the logical output N2-1 must be different. Accordingly, in response the NAND gate 44 generates the clock signal CLK-1 to be at logic "1."

During the reset state of the TLG-1 in the TLE 10-1 when the clock signal CLK-1 is "1", both the logical output N1-1 and the logical output N2-1 are provided as logical "1" since the DLO-1 is in the precharge state. However, during the evaluation state of the TLG-1, the TLG-1 is configured to generate the DLO-1 in one of the differential logical states in accordance with the threshold logic function of the TLG-1. The DLO-1 is provided to the sequential state element 20-1. The sequential state element 20-1 is configured to generate the logical output Q-1 and the logical output Q'-1, which are provided as data inputs for the next pipeline stage.

One implementation of the TLG-I and the TLE-1 is used to implement the equivalent of a 3-input XOR logic function, where the three Boolean variables that serve as logic inputs for the XOR logic function are referred to as BLV1, BLV2, BLV3. The TLG-I and the TLG-1 are required to implement the 3-input XOR logic function because the 3-input XOR logic function is not monotonic and thus must be split. The logical signals are assigned as follows:

| Logical signal | Assignment |
| --- | --- |
| x0-I | Inverse of BLV1 |
| x1-I | Inverse of BLV2 |
| x2-I | Inverse of BLV3 |
| VO1-I | Random |
| VO2-I | Random |
| y0-I | BLV1 |
| y1-I | BLV2 |
| y2-I | BLV3 |
| WO1-I | Random |
| WO2-I | Random |
| x0-1 | N2-I |
| x1-1 | N2-I |
| x2-1 | Inverse of BLV1 |
| x3-1 | Inverse of BLV2 |
| x4-I | Inverse of BLV3 |
| VO1-1 | Random |
| VO2-1 | Random |
| y0-1 | N1 |
| y1-1 | N1 |
| y2-1 | BLV1 |
| y3-1 | BLV2 |
| y4-1 | BLV3 |
| WO1-1 | Random |
| WO2-1 | Random |

Furthermore, the semiconductor die 42 is a complementary metal oxide semiconductor type die created with 65 nm technology. In comparison to the same circuitry except where no obfuscation is provided, the digital circuitry 40 only increases a delay by 5.1%. Furthermore, in comparison to an obfuscated Boolean network used to implement the same 3 input XOR function, the digital circuitry 40 consumed 27% less area, 30% less power, and had 45.2% less leakage current.

Those skilled in the art will recognize improvements and modifications to the preferred embodiments of the present disclosure. All such improvements and modifications are considered within the scope of the concepts disclosed herein and the claims that follow.

What is claimed is:

1. A threshold logic element comprising:
   a first input gate network configured to receive a first set of logical signals;
   a second input gate network configured to receive a second set of logical signals; and
   a differential sense amplifier operably associated with the first input gate network and the second input gate network such that the differential sense amplifier is configured to generate a differential logical output in accordance with a threshold logic function;
   wherein the differential sense amplifier is configured to feedback the differential logical output to the first input gate network and the second input gate network, and the first input gate network comprises a first obfuscated transmission gate that is obfuscated such that the first obfuscated transmission gate is incapable of effecting the threshold logic function.

2. The threshold logic element of claim 1 wherein the first obfuscated transmission gate is configured to receive a first logical signal of the first set of logical signals, wherein the first obfuscated transmission gate is obfuscated such that the first obfuscated transmission gate is incapable of effecting the threshold logic function wherein the first obfuscated transmission gate is obfuscated such that the threshold logic function is independent of the first logical signal.

3. The threshold logic element of claim 1 wherein the first obfuscated transmission gate is configured to receive a first logical signal of the first set of logical signals and wherein the first obfuscated transmission gate is obfuscated by defining a first threshold voltage such that the first obfuscated transmission gate is incapable of being turned on by the first logical signal.

4. The threshold logic element of claim 1 wherein the first input gate network comprises a first set of transmission gates comprising the first obfuscated transmission gate and first operational transmission gates and wherein:
   the first set of logical signals comprise a first logical signal and a first subset of logical signals;
   the first obfuscated transmission gate being incapable of effecting the threshold logic function includes obfuscating the first obfuscated transmission gate such that the first obfuscated transmission gate is incapable of being turned on by the first logical signal; and
   each of the first operational transmission gates is configured to receive a corresponding one of the first subset of logical signals, wherein the first operational transmission gates are configured such that the threshold logic function is assigned at least partially in accordance the first subset of logical signals.

5. The threshold logic element of claim 1 wherein the first input gate network comprises a first set of transmission gates comprising the first obfuscated transmission gate and first operational transmission gates wherein:
   the first obfuscated transmission gate defines a first threshold voltage; and
   the first operational transmission gates correspond to a first set of threshold voltages such that each of the first operational transmission gates defines a corresponding threshold voltage of the first set of threshold voltages;
   wherein the first threshold voltage defined by the first obfuscated transmission gate is greater than every one of the first set of threshold voltages such that the first obfuscated transmission gate is incapable of effecting the threshold logic function.

6. The threshold logic element of claim 5 wherein each of the first set of threshold voltages defined by the first operational transmission gates are approximately equal.

7. The threshold logic element of claim 1 wherein the first input gate network comprises a first set of transmission gates comprising first obfuscated transmission gates and first operational transmission gates, the first obfuscated transmission gates include the first obfuscated transmission gate and wherein:
   the first obfuscated transmission gates correspond with a first set of threshold voltages such that each of the first obfuscated transmission gates defines a corresponding one of the first set of threshold voltages; and
   the first operational transmission gates correspond to a second set of threshold voltages such that each of the first operational transmission gates defines a corresponding threshold voltage of the second set of threshold voltages;
   wherein every one of the first set of threshold voltages has a greater magnitude than every one of the second set of threshold voltages so that every one of the first obfuscated transmission gates is incapable of effecting the threshold logic function.

8. The threshold logic element of claim 7 wherein:
   each of the first set of threshold voltages defined by the first obfuscated transmission gates is approximately equal; and
   each of the second set of threshold voltages defined by the first operational transmission gates is approximately equal.

9. The threshold logic element of claim 1 wherein the second input gate network comprises a second obfuscated transmission gate that is obfuscated such that the second obfuscated transmission gate is incapable of effecting the threshold logic function.

10. The threshold logic element of claim 9 wherein:
    the first obfuscated transmission gate configured to receive a first logical signal of the first set of logical signals, wherein the first obfuscated transmission gate being obfuscated such that the first obfuscated transmission gate is incapable of effecting the threshold logic function includes obfuscating the first obfuscated transmission gate such that the threshold logic function is independent of the first logical signal; and
    the second obfuscated transmission gate configured to receive a second logical signal of the second set of logical signals, wherein the second obfuscated transmission gate being obfuscated such that the second obfuscated transmission gate is incapable of effecting the threshold logic function includes obfuscating the second obfuscated transmission gate such that the threshold logic function is independent of the second logical signal.

11. The threshold logic element of claim 9 wherein:
the first obfuscated transmission gate is obfuscated by defining a first threshold voltage such that the first obfuscated transmission gate is incapable of being turned on; and
the second obfuscated transmission gate is obfuscated by defining a second threshold voltage such that the second obfuscated transmission gate is incapable of being turned on.

12. The threshold logic element of claim 9 wherein the first input gate network comprises a first set of transmission gates comprising the first obfuscated transmission gate and first operational transmission gates and the second input gate network comprises a second set of transmission gates comprising the second obfuscated transmission gate and second operational transmission gates and wherein:
the first set of logical signals comprise a first logical signal and a first subset of logical signals;
the second set of logical signals comprise a second logical signal and a second subset of logical signals;
the first obfuscated transmission gate is incapable of effecting the threshold logic function includes obfuscating the first obfuscated transmission gate such that the first obfuscated transmission gate is incapable of being turned on by the first logical signal;
each of the first operational transmission gates is configured to receive a corresponding one of the first subset of logical signals;
the second obfuscated transmission gate is incapable of effecting the threshold logic function includes obfuscating the second obfuscated transmission gate such that the second logical signal is incapable of being turned on by the second logical signal; and
each of the second operational transmission gates is configured to receive a corresponding one of the second subset of logical signals;
wherein the first operational transmission gates and the second operational transmission gates are configured such that the threshold logic function is a function of the first subset of logical signals and the second subset of logical signals.

13. The threshold logic element of claim 9 wherein:
the first input gate network comprises a first set of transmission gates comprising the first obfuscated transmission gate and first operational transmission gates;
the second input gate network comprises a second set of transmission gates comprising the second obfuscated transmission gate and second operational transmission gates;
the first obfuscated transmission gate defines a first threshold voltage;
the second obfuscated transmission gate defines a second threshold voltage;
the first operational transmission gates correspond to a first set of threshold voltages such that each of the first operational transmission gates defines a corresponding threshold voltage of the first set of threshold voltages;
wherein the first threshold voltage defined by the first obfuscated transmission gate is greater in magnitude than every one of the first set of threshold voltages so as to obfuscate the first obfuscated transmission gate; and
the second operational transmission gates correspond to a second set of threshold voltages such that each of the second operational transmission gates defines a corresponding threshold voltage of the second set of threshold voltages.

14. The threshold logic element of claim 13 wherein:
each of the first set of threshold voltages defined by the first operational transmission gates is approximately equal; and
each of the second set of threshold voltages defined by the second operational transmission gates is approximately equal.

15. The threshold logic element of claim 14 wherein the first threshold voltage and the second threshold voltage are approximately equal.

16. The threshold logic element of claim 15 wherein each of the first set of threshold voltages and each of the second set of threshold voltages are approximately equal.

17. The threshold logic element of claim 1 further comprising a sequential state element configured to receive the differential logical output.

18. The threshold logic element of claim 17 wherein:
the differential sense amplifier is operable to generate the differential logical output so that the differential logical output has a first logical output and a second logical output; and
the sequential state element is an SR latch having a set terminal configured to receive the first logical output and a reset terminal configured to receive the second logical output.

19. The threshold logic element of claim 1 wherein:
the differential sense amplifier is operable to generate the differential logical output so that the differential logical output has a first logical output and a second logical output; and
the differential sense amplifier is configured to feedback the differential logical output to the first input gate network and the second input gate network by being configured to provide the first logical output to the first input gate network as one of the first set of logical signals and to provide the second logical output to the second input gate network as one of the second set of logical signals.

* * * * *

UNITED STATES PATENT AND TRADEMARK OFFICE
CERTIFICATE OF CORRECTION

PATENT NO. : 9,876,503 B2
APPLICATION NO. : 15/390970
DATED : January 23, 2018
INVENTOR(S) : Vrudhula et al.

Page 1 of 1

It is certified that error appears in the above-identified patent and that said Letters Patent is hereby corrected as shown below:

In the Specification

In Column 1, Line 11:
Delete the following paragraph:
"GOVERNMENT SUPPORT
This invention was made with government funds under contract numbers 1237856 and 1230401 and awarded by the National Science Foundation.The U.S. Government may have rights in this invention."

Insert the following paragraph:
-- GOVERNMENT SUPPORT CLAUSE
This invention was made with government support under 1237856 and 1230401 awarded by the National Science Foundation. The government has certain rights in the invention. --

Signed and Sealed this
Nineteenth Day of November, 2019

Andrei Iancu
*Director of the United States Patent and Trademark Office*